US012579344B2

(12) United States Patent \
Shelton et al.

(10) Patent No.: US 12,579,344 B2 \
(45) Date of Patent: Mar. 17, 2026

(54) HOSTING PRE-CERTIFIED SYSTEMS, REMOTE ACTIVATION OF CUSTOMER OPTIONS, AND OPTIMIZATION OF FLIGHT ALGORITHMS IN AN EMULATED ENVIRONMENT WITH REAL WORLD OPERATIONAL CONDITIONS AND DATA

(71) Applicant: The Boeing Company, Chicago, IL (US)

(72) Inventors: Jason W. Shelton, Edgewood, WA (US); Timothy M. Mitchell, Seattle, WA (US); Gail Bohnhoff-Hlavacek, Seattle, WA (US)

(73) Assignee: The Boeing Company, Arlington, VA (US)

( * ) Notice: Subject to any disclaimer, the term of this patent is extended or adjusted under 35 U.S.C. 154(b) by 1168 days.

(21) Appl. No.: 17/471,839

(22) Filed: Sep. 10, 2021

(65) Prior Publication Data

US 2022/0083714 A1 Mar. 17, 2022

Related U.S. Application Data

(60) Provisional application No. 63/078,692, filed on Sep. 15, 2020.

(51) Int. Cl.
*G06F 30/27* (2020.01)
*B64D 45/00* (2006.01)
(Continued)

(52) U.S. Cl.
CPC ................. *G06F 30/27* (2020.01); *B64F 5/60* (2017.01); *G06F 9/455* (2013.01);
(Continued)

(58) Field of Classification Search
None
See application file for complete search history.

(56) References Cited

U.S. PATENT DOCUMENTS

| | | | | | |
|---|---|---|---|---|---|
| 5,023,791 A | * | 6/1991 | Herzberg | ........... | G05B 23/0283 |
| | | | | | 324/73.1 |
| 5,161,158 A | * | 11/1992 | Chakravarty | ......... | G06F 11/261 |
| | | | | | 714/E11.167 |

(Continued)

OTHER PUBLICATIONS

Extended European Search Report dated Feb. 4, 2022 from corresponding application No. EP 21 19 6441, 11 pages.

(Continued)

*Primary Examiner* — Akash Saxena \
(74) *Attorney, Agent, or Firm* — Harrity & Harrity, LLP

(57) ABSTRACT

Systems, methods, and apparatus for hosting pre-certified systems, remote activation of customer options, and optimization of flight algorithms in an emulated environment with real world operational conditions and data are disclosed. A method for operating in an emulated environment comprises generating and outputting, by a plurality of production line replaceable units (LRUs) operating in an operational environment, physical environmental data and production LRU output data. The method further comprises emulating, by a plurality of emulators in an emulation server, the production LRUs. Also, the method comprises generating and outputting, by the emulators using the physical environmental data, a model of the operational environment. Further, the method comprises generating and outputting, by a plurality of pre-certified LRUs using the model of the operational environment, pre-certified LRU output data. In one or more embodiments, the pre-certified LRUs correspond to the production LRUs.

20 Claims, 14 Drawing Sheets

Real LRU \
110

Patch Panel \
120

100

130a \
Emulated LRU

130b \
Emulated LRU

130c \
Emulated LRU

130d \
Emulated LRU

130e \
Emulated LRU

(51) Int. Cl.

| | |
|---|---|
| *B64D 47/00* | (2006.01) |
| *B64F 5/60* | (2017.01) |
| *G06F 9/455* | (2018.01) |
| *G06F 11/3668* | (2025.01) |
| *G06F 11/3698* | (2025.01) |
| *G06F 30/15* | (2020.01) |

(52) U.S. Cl.
CPC ...... *G06F 11/3692* (2013.01); *G06F 11/3698* (2025.01); *G06F 30/15* (2020.01); *B64D 2045/0085* (2013.01); *B64D 47/00* (2013.01)

(56) References Cited

U.S. PATENT DOCUMENTS

| | | | | |
|---|---|---|---|---|
| 5,260,874 | A * | 11/1993 | Berner | G09B 9/24 |
| | | | | 434/242 |
| 5,541,863 | A * | 7/1996 | Magor | G05B 17/02 |
| | | | | 702/123 |
| 5,552,984 | A * | 9/1996 | Crandall | G06F 11/2273 |
| | | | | 703/2 |
| 5,778,203 | A * | 7/1998 | Birkedahl | H04L 12/40 |
| | | | | 701/14 |
| 6,115,656 | A * | 9/2000 | Sudolsky | B64F 5/60 |
| | | | | 701/3 |
| 6,895,582 | B1 * | 5/2005 | Greve | G06F 11/1484 |
| | | | | 718/1 |
| 8,341,298 | B2 * | 12/2012 | Wilber | H04L 67/12 |
| | | | | 709/249 |
| 8,522,237 | B2 * | 8/2013 | Hotra | G06F 9/5077 |
| | | | | 718/1 |
| 10,162,787 | B1 * | 12/2018 | Paustian | G06F 13/24 |
| 10,353,727 | B2 * | 7/2019 | Alvarez | G06F 9/5077 |
| 11,175,937 | B2 * | 11/2021 | Shelton | B64F 5/60 |
| 2004/0180653 | A1 * | 9/2004 | Royalty | H04L 67/12 |
| | | | | 455/431 |
| 2006/0126608 | A1 * | 6/2006 | Pereira | H04L 41/0853 |
| | | | | 370/360 |
| 2009/0112569 | A1 * | 4/2009 | Angus | B64F 5/60 |
| | | | | 703/22 |

| | | | | |
|---|---|---|---|---|
| 2009/0119087 | A1 * | 5/2009 | Ang | G06F 9/45558 |
| | | | | 703/23 |
| 2010/0318834 | A1 * | 12/2010 | Planche | G06F 11/2025 |
| | | | | 714/3 |
| 2011/0071709 | A1 * | 3/2011 | Damiani | G06F 8/30 |
| | | | | 701/3 |
| 2012/0015644 | A1 * | 1/2012 | Danford | H04L 67/04 |
| | | | | 455/419 |
| 2012/0197480 | A1 * | 8/2012 | Beninca | B64F 5/60 |
| | | | | 701/29.9 |
| 2012/0271616 | A1 * | 10/2012 | Ludwig | G06F 3/14 |
| | | | | 703/28 |
| 2013/0166271 | A1 * | 6/2013 | Danielsson | G06F 11/3698 |
| | | | | 703/22 |
| 2015/0227647 | A1 * | 8/2015 | Shelton | G06F 30/18 |
| | | | | 703/13 |
| 2016/0188675 | A1 * | 6/2016 | Vossler | G06F 16/242 |
| | | | | 707/776 |
| 2016/0340055 | A1 * | 11/2016 | Floyd | H04L 63/1441 |
| 2017/0214707 | A1 * | 7/2017 | Grubel | G06F 21/564 |
| 2018/0285134 | A1 * | 10/2018 | Hotra | G06F 12/063 |
| 2019/0026154 | A1 * | 1/2019 | Desai | G06F 9/4856 |
| 2019/0121745 | A1 * | 4/2019 | Hoppert | G06F 9/45558 |
| 2019/0173846 | A1 * | 6/2019 | Patterson | H04L 63/0272 |
| 2019/0303188 | A1 * | 10/2019 | Shelton | G06F 9/45558 |
| 2019/0311087 | A1 * | 10/2019 | Jackson | G06F 30/15 |
| 2020/0160742 | A1 * | 5/2020 | Hotra | G06F 3/016 |
| 2020/0258414 | A1 * | 8/2020 | Boldenow | G06T 11/60 |
| 2021/0335059 | A1 * | 10/2021 | Dixit | G05B 23/0254 |
| 2022/0083714 | A1 * | 3/2022 | Shelton | G06F 11/3698 |
| 2022/0121559 | A1 * | 4/2022 | Rollini | G06F 11/3447 |
| 2022/0374006 | A1 * | 11/2022 | Bati | G05B 23/0283 |

OTHER PUBLICATIONS

Anonymous: "Computer simulation—Wikipedia", Sep. 10, 2020, pp. 1-13, XP055883404, Retrieved from the Internet: URL:https://en.Wikipedia.org/w/index.php?title=Computer_simulation&oldid=977679200 [retrieved on Jan. 25, 2022].

* cited by examiner

130a  Emulated LRU
130b  Emulated LRU
130c  Emulated LRU
130d  Emulated LRU
130e  Emulated LRU Patch Panel
120

Real LRU
110

100

200

BLACK LABEL
(PRODUCTION)
210

RED LABEL
(PRE-PROD)
220

BLUE LABEL
(BETA)
230

810

820

820

830

800

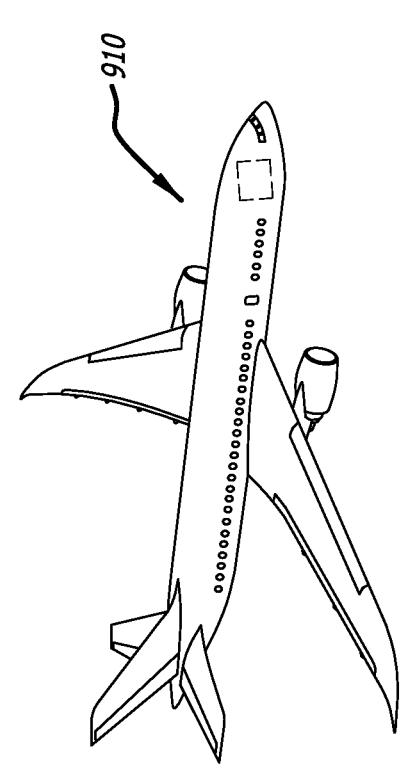
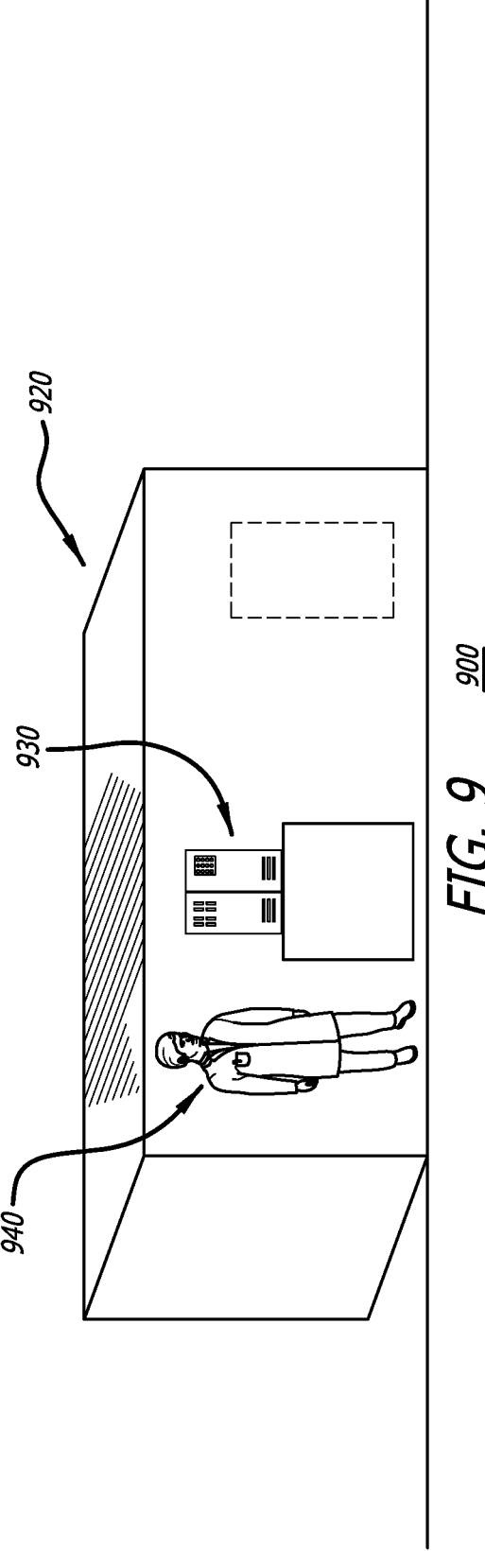
*FIG. 9*

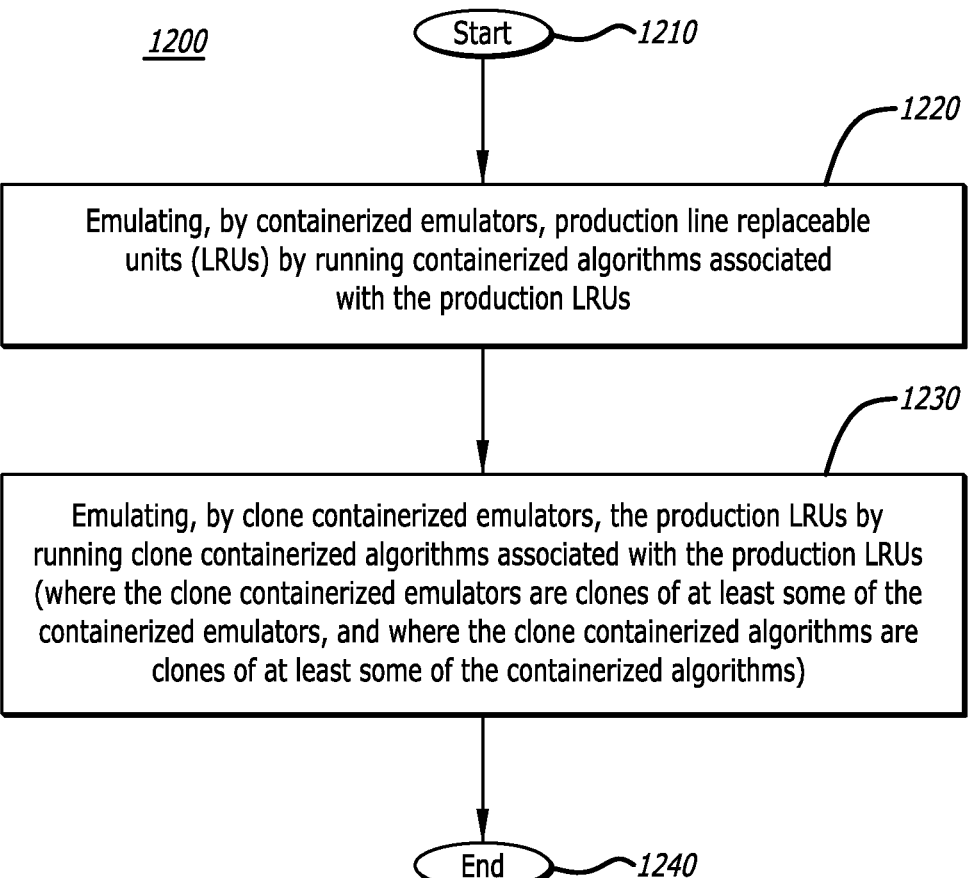

*1200*

Start — *1210*

*1220*

Emulating, by containerized emulators, production line replaceable units (LRUs) by running containerized algorithms associated with the production LRUs

*1230*

Emulating, by clone containerized emulators, the production LRUs by running clone containerized algorithms associated with the production LRUs (where the clone containerized emulators are clones of at least some of the containerized emulators, and where the clone containerized algorithms are clones of at least some of the containerized algorithms)

End — *1240*

FIG. 13

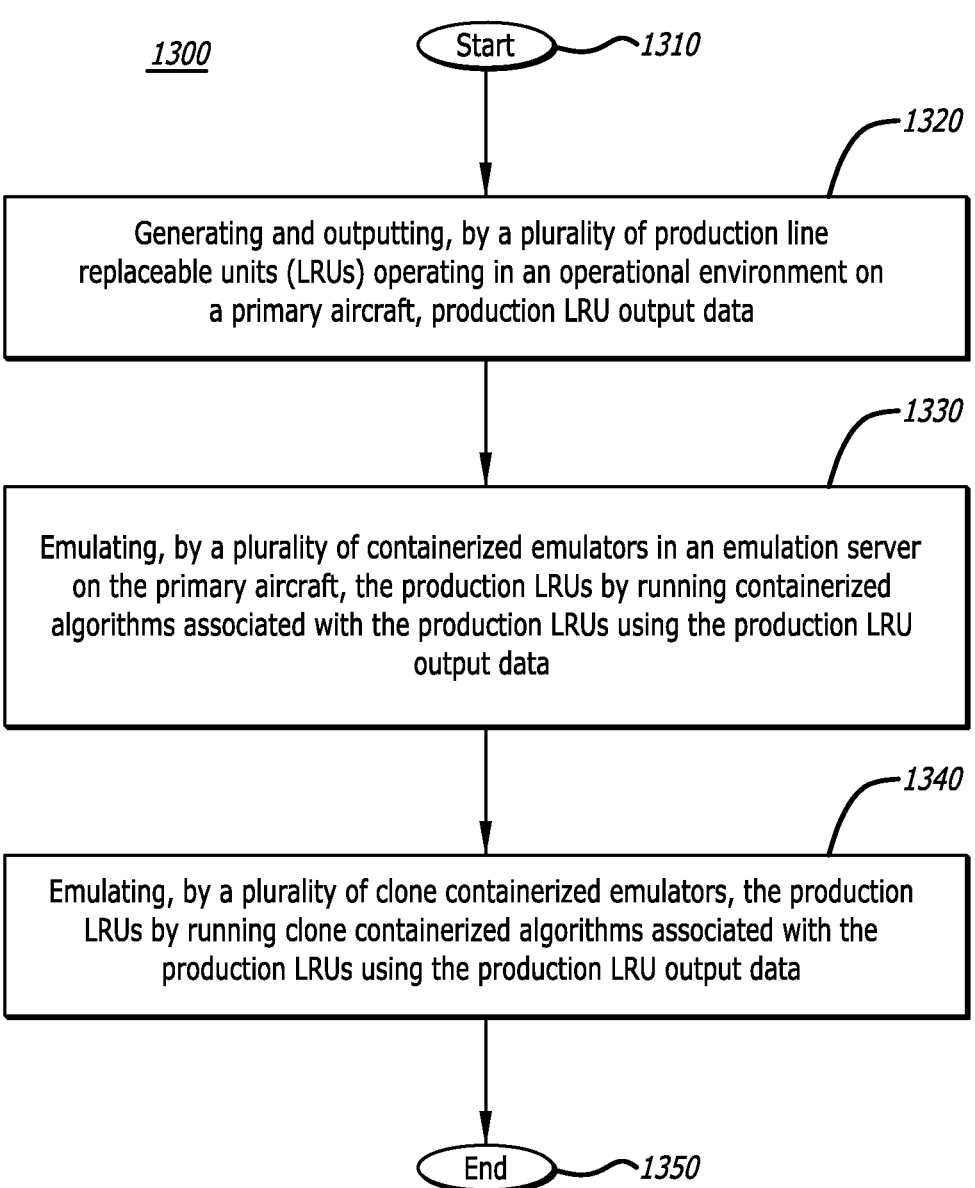

_1300_

Start ⟩— _1310_

_1320_

Generating and outputting, by a plurality of production line replaceable units (LRUs) operating in an operational environment on a primary aircraft, production LRU output data

_1330_

Emulating, by a plurality of containerized emulators in an emulation server on the primary aircraft, the production LRUs by running containerized algorithms associated with the production LRUs using the production LRU output data

_1340_

Emulating, by a plurality of clone containerized emulators, the production LRUs by running clone containerized algorithms associated with the production LRUs using the production LRU output data End ⟩— _1350_

HOSTING PRE-CERTIFIED SYSTEMS, REMOTE ACTIVATION OF CUSTOMER OPTIONS, AND OPTIMIZATION OF FLIGHT ALGORITHMS IN AN EMULATED ENVIRONMENT WITH REAL WORLD OPERATIONAL CONDITIONS AND DATA

CROSS REFERENCE TO RELATED APPLICATIONS

The present invention claims priority to U.S. Provisional Patent Application Ser. No. 63/078,692, filed Sep. 15, 2020, which is incorporated herein by reference in its entirety.

FIELD

The present disclosure relates to an emulated environment. In particular, the present disclosure relates to hosting pre-certified systems, remote activation of customer options, and optimization of flight algorithms in an emulated environment with real world operational conditions and data.

BACKGROUND

Currently, aviation systems (e.g., aviation line replaceable units (LRUs)) must be developed in laboratories, and matured throughout a lengthy certification process. As such, development and certification cycles are excessively lengthy. In addition, flight conditions and data are often simulated, thereby shortening the window for identifying anomalies prior to certification. This often necessitates urgent fixes just prior to certification. Additionally, customers are sold options for the unit that they agree upon before the unit is built. This limits which products and services customers are able to sample, as the aircraft is certified in a semi-static configuration.

In light of the foregoing, there is a need for an improved method and system for developing and testing systems for certification.

SUMMARY

The present disclosure relates to a method, system, and apparatus for hosting pre-certified systems, remote activation of customer options, and optimization of flight algorithms in an emulated environment with real world operational conditions and data. In one or more embodiments, a disclosed method for operating in an emulated environment comprises generating and outputting, by a plurality of production line replaceable units (LRUs) operating in an operational environment, physical environmental data and production LRU output data. The method further comprises emulating, by a plurality of emulators in an emulation server, the production LRUs. Also, the method comprises generating and outputting, by the emulators using the physical environmental data, a model of the operational environment. Further, the method comprises generating and outputting, by a plurality of pre-certified LRUs using the model of the operational environment, pre-certified LRU output data. In one or more embodiments, the pre-certified LRUs correspond to the production LRUs.

In at least one embodiment, the method further comprises comparing the production LRU output data with the pre-certified LRU output data.

In one or more embodiments, the production LRUs are connected to the emulation server via at least one input connector and an input patch panel. In some embodiments, at least one input connector comprises an Aeronautical Radio Incorporated (ARINC) 600 connector, a Quadrax connector, an ARINC 429/628 connector, and/or a universal serial bus (USB) port.

In at least one embodiment, the emulation server is connected to the pre-certified LRUs via at least one output connector and an output patch panel. In some embodiments, at least one output connector comprises an ARINC 600 connector, a Quadrax connector, an ARINC 429/628 connector, and/or a USB port.

In one or more embodiments, the production LRUs and the pre-certified LRUs comprise a mission computer, a flight management unit, an autopilot unit, a communications unit, a navigation unit, a collision avoidance unit, and/or a sensor.

In at least one embodiment, the method further comprises translating, by the emulation server, the production LRU output data, which uses LRU data protocols to production LRU output data, which uses emulator protocols. In some embodiments, the method further comprises translating, by the emulation server, the model of the operational environment, which uses emulator protocols, to a model of the operational environment, which uses LRU data protocols.

In one or more embodiments, the production LRUs are operating on a vehicle. In some embodiments, the vehicle is one of an airborne vehicle, a space vehicle, a terrestrial vehicle, or a marine vehicle. In at least one embodiment, the pre-certified LRUs are operating on the vehicle or in a ground facility. In at least one embodiment, the emulation server is operating on the vehicle or in a ground facility.

In at least one embodiment, the method further comprises generating, by the emulation server, a model of behavior of the vehicle based on the model of the operational environment. In some embodiments, the method further comprises optimizing, by the emulation server, operation of at least one of the emulators based on at least one model of behavior (e.g., which may be based on previous flights) of the vehicle. In one or more embodiments, the optimizing of the operation of at least one of the emulators comprises optimizing at least one algorithm of at least one of the emulators. In some embodiments, the emulation server uses machine learning to optimize the operation of at least one of the emulators based on at least one model of behavior of the vehicle.

In one or more embodiments, the method further comprises activating at least one customer option on at least one of the emulators and/or on at least one of the pre-certified LRUs. In some embodiments, the method further comprises running, on at least one of the emulators, at least one pre-certified algorithm.

In at least one embodiment, a system for operating in an emulated environment comprises a plurality of production LRUs, operating in an operational environment, to generate and to output physical environmental data and production LRU output data. The system further comprises a plurality of emulators, in an emulation server, to emulate the production LRUs, and to generate and output a model of the operational environment using the physical environmental data. Further, the system comprises a plurality of pre-certified LRUs, which correspond to the production LRUs, to generate and output pre-certified LRU output data by using the model of the operational environment.

In one or more embodiments, a method for operating in an emulated environment comprises emulating, by containerized emulators, production LRUs by running containerized algorithms associated with the production LRUs. The method further comprises emulating, by clone containerized emulators, the production LRUs by running clone containerized algorithms associated with the production LRUs. In one or more embodiments, the clone containerized emulators are clones of at least some of the containerized emulators, and/or the clone containerized algorithms are clones of at least some of the containerized algorithms.

In at least one embodiment, the containerized emulators are isolated from one another, and isolated from the clone containerized emulators. In some embodiments, the clone containerized emulators are isolated from one another, and isolated from the containerized emulators.

In one or more embodiments, the emulating by the containerized emulators and the emulating by the clone containerized emulators occurs simultaneously. In some embodiments, the containerized emulators are located in an emulation server. In at least one embodiment, the clone containerized emulators are located in an emulation server and/or remote from the emulation server.

In at least one embodiment, the containerized algorithms are isolated from one another, and from the clone containerized algorithms. In some embodiments, the clone containerized algorithms are isolated from one another, and from the containerized algorithms.

In one or more embodiments, the method further comprises running, by at least one of the containerized emulators, at least one of the clone containerized algorithms to provide redundancy. In some embodiments, the production LRUs comprise a mission computer, a flight management unit, an autopilot unit, a communications unit, a navigation unit, a collision avoidance unit, and/or a sensor.

In at least one embodiment, the production LRUs are operating on a vehicle. In some embodiments, the vehicle is an airborne vehicle, a space vehicle, a terrestrial vehicle, or a marine vehicle.

In one or more embodiments, an emulation server is operating on the vehicle or remote from the vehicle. In some embodiments, the clone containerized emulators are operating on the vehicle and/or remote from the vehicle.

In at least one embodiment, a system for operating in an emulated environment comprises a plurality of containerized emulators to emulate production LRUs by running containerized algorithms associated with the production LRUs. The system further comprises a plurality of clone containerized emulators to emulate the production LRUs by running clone containerized algorithms associated with the production LRUs. In one or more embodiments, the clone containerized emulators are clones of at least some of the containerized emulators, and/or the clone containerized algorithms are clones of at least some of the containerized algorithms.

In one or more embodiments, the containerized emulators and the clone containerized emulators are configured to simultaneously emulate.

In at least one embodiment, a method for operating in an emulated environment comprises generating and outputting, by a plurality of production LRUs operating in an operational environment on a primary aircraft, production LRU output data. The method further comprises emulating, by a plurality of containerized emulators in an emulation server on the primary aircraft, the production LRUs by running containerized algorithms associated with the production LRUs using the production LRU output data. Further, the method comprises emulating, by a plurality of clone containerized emulators, the production LRUs by running clone containerized algorithms associated with the production LRUs using the production LRU output data.

In one or more embodiments, the clone containerized emulators are clones of at least some of the containerized emulators. In some embodiments, the clone containerized algorithms are clones of at least some of the containerized algorithms.

In at least one embodiment, at least some of the clone containerized emulators are located on a secondary aircraft and at least some of the clone containerized emulators are located at a ground station. In some embodiments, the containerized emulators on the primary aircraft, the clone containerized emulators located on the secondary aircraft, and the clone containerized emulators located at the ground station have different configurations. In one or more embodiments, the method further comprises comparing, by a comparator to identify differences, output data from the containerized emulators on the primary aircraft, output data from the clone containerized emulators located on the secondary aircraft, and output data from the clone containerized emulators located at the ground station. In some embodiments, the method further comprises updating, according to the differences, at least one of the clone containerized algorithms of the clone containerized emulators located one of on the secondary aircraft or at the ground station.

In one or more embodiments, the containerized emulators on the primary aircraft, the clone containerized emulators located on the secondary aircraft, and the clone containerized emulators located at the ground station have a same configuration. In at least one embodiment, the secondary aircraft is following the primary aircraft on a same flight path. In some embodiments, the method further comprises receiving, by the clone containerized emulators on the secondary aircraft and at the ground station, flight data from the containerized emulators on the primary aircraft; and updating at least one of the clone containerized algorithms running on the clone containerized emulators on the secondary aircraft and at the ground station according to the flight data.

In at least one embodiment, the clone containerized emulators are located on a plurality of aircraft. In one or more embodiments, the plurality of aircraft and the primary aircraft are located proximate one another. In some embodiments, the method further comprising sharing, by the clone containerized emulators on the plurality of aircraft and the containerized emulators on the primary aircraft, flight data with one other.

In one or more embodiments, the clone containerized emulators are located on a flight simulator. In some embodiments, the method further comprises sharing, by the containerized emulators on the primary aircraft, flight data with the clone containerized emulators located on the flight simulator.

In at least one embodiment, the clone containerized emulators are located in a laboratory. In some embodiments, the method further comprises sharing, by the containerized emulators on the primary aircraft, flight data with the clone containerized emulators located in the laboratory.

In one or more embodiments, a system for operating in an emulated environment comprises a plurality of production LRUs, operating in an operational environment on a primary aircraft, to generate and output production LRU output data. The system further comprises a plurality of containerized emulators, in an emulation server on the primary aircraft, to emulate the production LRUs by running containerized algorithms associated with the production LRUs using the production LRU output data. Further, the system comprises a plurality of clone containerized emulators to emulate the production LRUs by running clone containerized algorithms associated with the production LRUs using the production LRU output data.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

FIG. 9 is a diagram showing the disclosed system for operating an in emulated environment comprising an aircraft and a ground facility comprising a laboratory being used by a user, in accordance with at least one embodiment of the present disclosure.

FIG. 12 is flow chart showing another disclosed method for operating an in emulated environment, in accordance with at least one embodiment of the present disclosure.

FIG. 13 is flow chart showing yet another disclosed method for operating an in emulated environment, in accordance with at least one embodiment of the present disclosure.

DESCRIPTION

Figure 1:
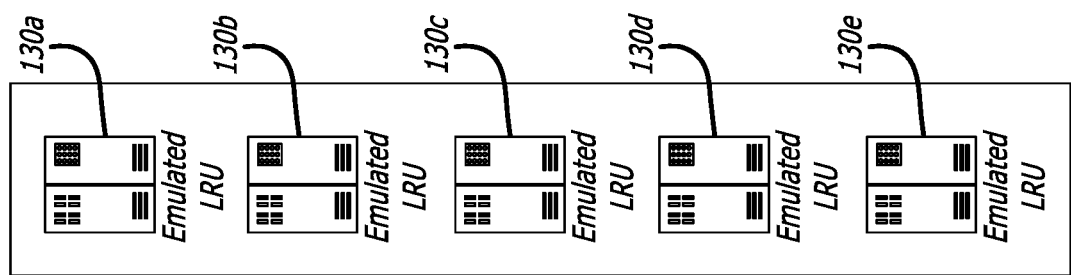
FIG. 1 is a diagram showing exemplary components employed by the disclosed system for operating in an emulated environment, in accordance with at least one embodiment of the present disclosure.

The methods and apparatus disclosed herein provide operative systems for hosting pre-certified systems, remote activation of customer options, and optimization of flight algorithms in an emulated environment with real world operational conditions and data. In one or more embodiments, the system of the present disclosure employs emulated systems (e.g., emulated line replaceable units (LRUs)) to certify vehicle (e.g., aircraft) systems (e.g., real LRUs), to remotely activate services, and to optimize system algorithms (e.g., LRU algorithms).

As previously mentioned above, currently, aviation systems (e.g., aviation LRUs) must be developed in laboratories, and matured throughout a lengthy certification process. As such, development and certification cycles are excessively lengthy. In addition, flight conditions and data are often simulated, thereby shortening the window for identifying anomalies prior to certification. This often necessitates urgent fixes just prior to certification. Additionally, customers are sold options for the unit (e.g., the LRU) that they agree upon before the unit is built. This limits which products and services customers are able to sample, as the aircraft is certified in a semi-static configuration.

The system of the present disclosure allows for systems and software to be developed while using real data (e.g., flight data). All instances can be run on certified or exploratory vehicles (e.g., aircraft), without impact to existing certified systems. In addition, mission (e.g., flight) and performance algorithms can be optimized so that they are of the upmost maturity in subsequent deployments. This can be extended to the development and certification cycles for autonomous vehicles.

In one or more embodiments of the disclosed system, emulated systems (e.g., emulated LRUs) are run in parallel with certified operational systems (e.g., certified real LRUs, such as avionics units). This allows for the intake of real-world data from real LRUs (e.g., sensors, probes, control surfaces, communication systems, propulsion systems, and flight systems) by emulated systems (e.g., emulated LRUs) running in a synchronous, yet isolated environment.

The system of the present disclosure makes it possible for pre-certified systems (e.g., pre-certified LRUs) to be run on certified vehicles (e.g., certified aircraft). Also, the disclosed system makes it possible to build next generation avionics on existing platforms. And, development of systems can be performed on cross-model platforms (e.g., on different models of aircraft).

In addition, the disclosed system allows for algorithms to be optimized by running through numerous permutations throughout all phases of flight. Systems and features can also be remotely activated to allow for customers' trial use of products and services.

The system of the present disclosure comprises a number of advantages over current solutions. A first advantage is that the disclosed system provides the ability to develop pre-production (e.g., red label) and beta (e.g., blue label) systems and/or software on certified vehicles (e.g., aircraft). A second advantage is that the disclosed system allows for remote activation of trial-based services. A third advantage is that the disclosed system allows for the ability to run experimental systems, software, and services in flight. And, a fourth advantage is that the disclosed system provides data diodes (e.g., only allowing for the one-way transfer of data) between the certified network (e.g., comprising certified LRUs (e.g., black label LRUs)) to pre-production and/or experimental environments (e.g., comprising red label and/or blue label LRUs) and, as such, no data corruption or adverse effects will be presented to the operational systems (e.g., the certified LRUs).

In the following description, numerous details are set forth in order to provide a more thorough description of the system. It will be apparent, however, to one skilled in the art, that the disclosed system may be practiced without these specific details. In the other instances, well known features have not been described in detail, so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that embodiments of the present disclosure may be practiced in conjunction with other components, and that the systems described herein are merely example embodiments of the present disclosure.

For the sake of brevity, conventional techniques and components related to vehicle (e.g., aircraft) systems, and other functional aspects of the system (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in one or more embodiments of the present disclosure.

FIG. 1 is a diagram showing exemplary components employed by the disclosed system 100 for operating in an emulated environment, in accordance with at least one embodiment of the present disclosure. In this figure, an exemplary line replaceable unit (LRU) (i.e. a real LRU) 110, a patch panel 120, and a plurality of emulated LRUs 130a, 130b, 130c, 130d, 130e (which are also referred to as emulators) are shown. In one or more embodiments, the disclosed system 100 may comprise at least one LRU 110, at least one patch panel 120, and/or at least one emulated LRU 130a, 130b, 130c, 130d, 130e.

An LRU 110 is a device (e.g., a computing device or a sensor) that may be employed by a vehicle. In one or more embodiments, various different types of LRUs may be employed for the LRU 110 of the disclosed system 100 including, but not limited to, a mission (e.g., flight) computer, a flight management unit, an autopilot unit, a communications unit, a navigation unit, a collision avoidance unit, and a sensor. In at least one embodiment, various different types of vehicles may employ the LRU 110 for the disclosed system 100 including, but not limited to, an airborne vehicle (e.g., an aircraft, such as 510 in FIG. 5, and a drone), a space vehicle (e.g., a satellite), a terrestrial vehicle (e.g., a utility vehicle, an automobile, and a tank), and a marine vehicle (e.g., a ship).

The patch panel 120 is a device that is used to communicatively connect the LRU 110 (i.e. a real LRU) to at least one emulated LRU 130a, 130b, 130c, 130d, 130e (e.g., via wire) in the disclosed system 100. An emulated LRU 130a, 130b, 130c, 130d, 130e is virtual hardware that emulates a specific type of LRU 110 (i.e. a real LRU).

Figure 2:
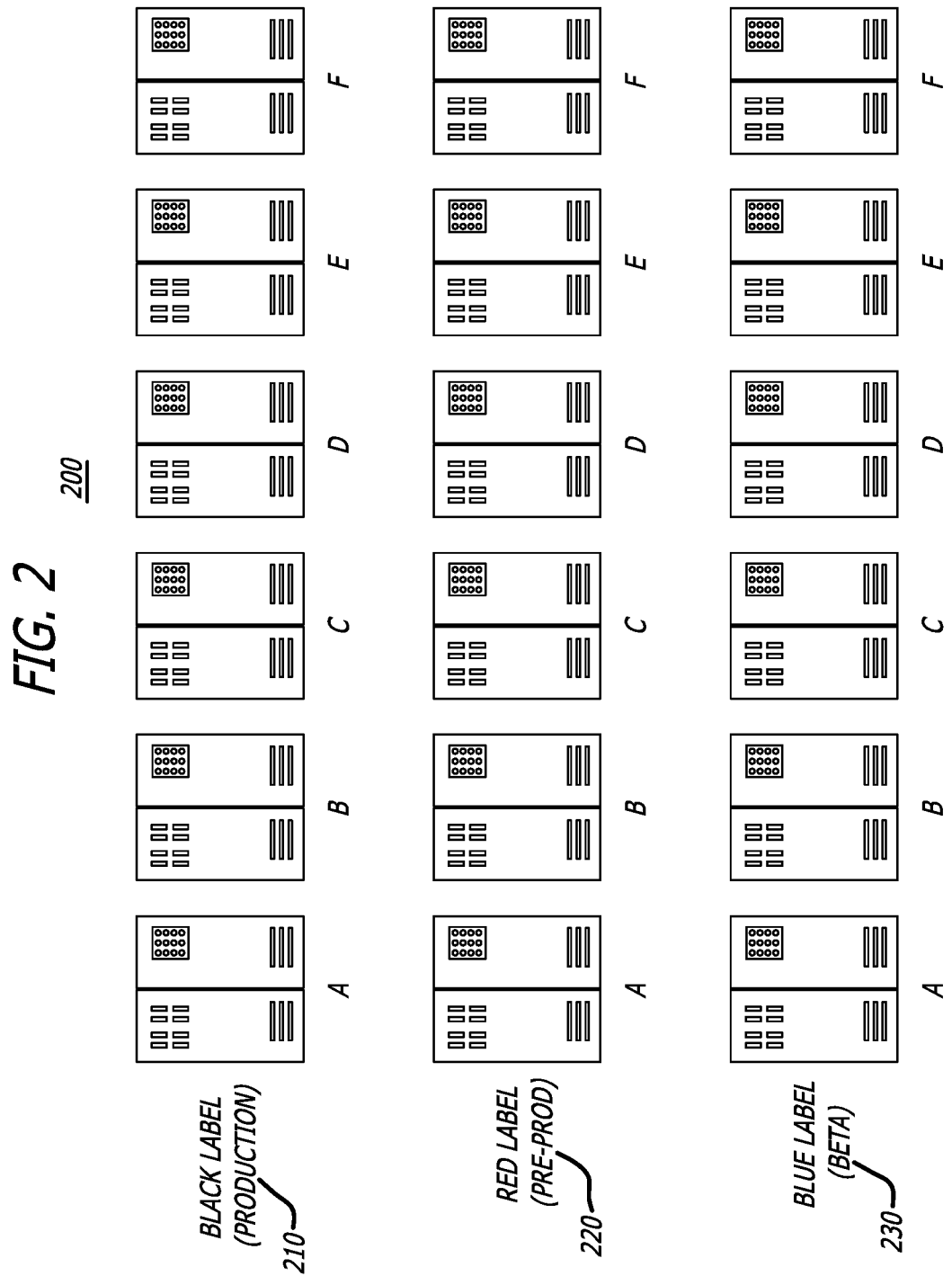
FIG. 2 is a diagram illustrating the different types of line replaceable units (LRUs), which may be employed by the disclosed system for operating an in emulated environment, in accordance with at least one embodiment of the present disclosure.

FIG. 2 is a diagram illustrating the different types of line replaceable units (LRUs) 210, 220, 230, which may be employed by the disclosed system 200 for operating an in emulated environment, in accordance with at least one embodiment of the present disclosure. In this figure, a plurality of black label (production) LRUs 210A, 210B, 210C, 210D, 210E, 210F; a plurality of red label (pre-production) LRUs 220A, 220B, 220C, 220D, 220E, 220F; and a plurality of blue label (beta) LRUs 230A, 230B, 230C, 230D, 230E, 230F are shown.

A black label (production) LRU 210A, 210B, 210C, 210D, 210E, 210F is an LRU that has been thoroughly tested and certified to be employed in and utilized by a vehicle. A red label (pre-production) LRU 220A, 220B, 220C, 220D, 220E, 220F is an LRU that has been produced (built) to the level of a black label (production) LRU 210A, 210B, 210C, 210D, 210E, 210F, but still needs to be thoroughly tested and certified prior be being installed onto a vehicle for use. And, a blue label (beta) LRU 230A, 230B, 230C, 230D, 230E, 230F is an experimental LRU design that is still being tested in the laboratory.

Figure 3:
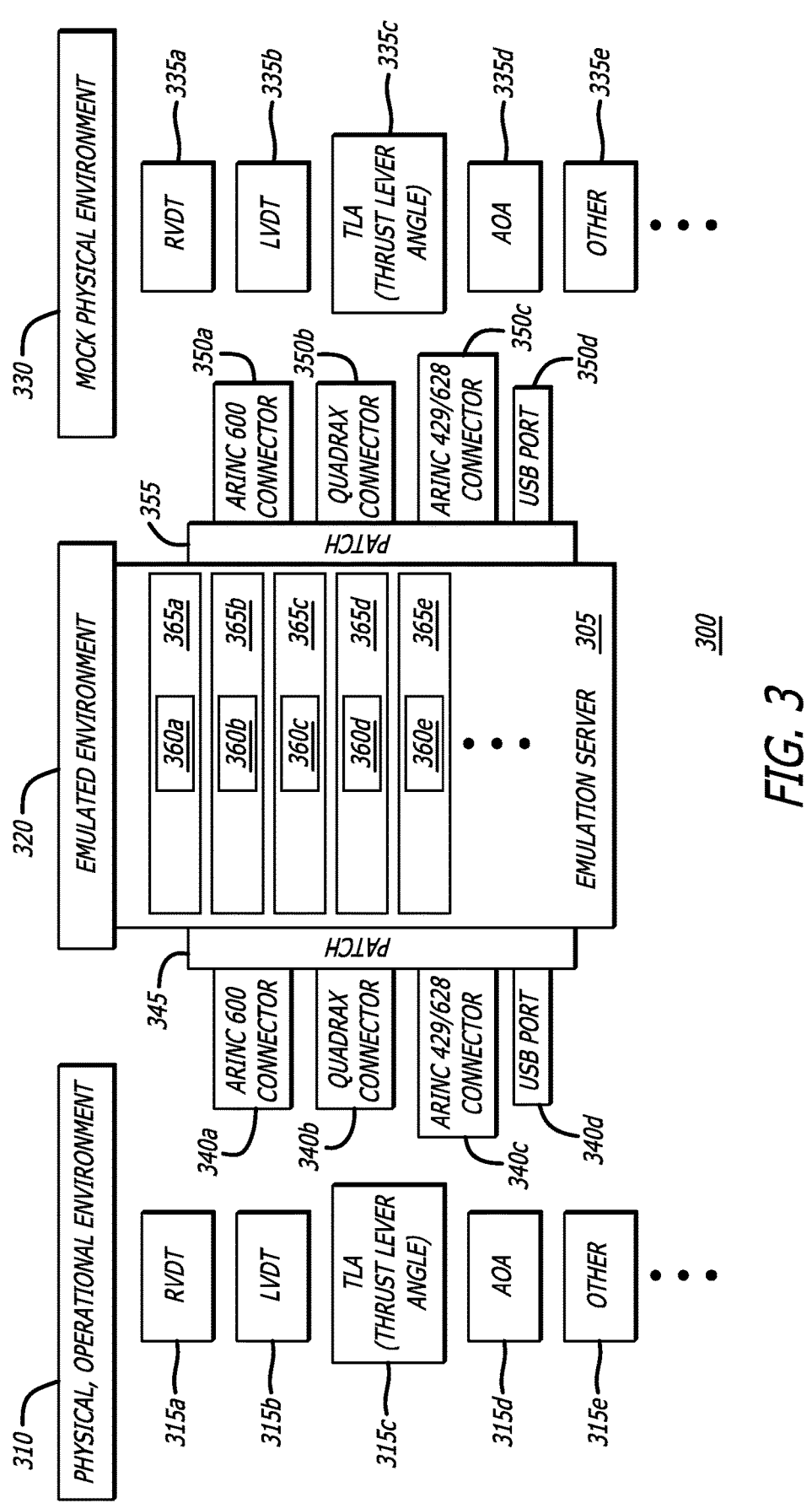
FIG. 3 is a diagram showing exemplary components for the various different environments of the disclosed system for operating in an emulated environment, in accordance with at least one embodiment of the present disclosure.

FIG. 3 is a diagram showing exemplary components for the various different environments of the disclosed system 300 for operating in an emulated environment, in accordance with at least one embodiment of the present disclosure. In this figure, various different environments of the disclosed system 300 are shown, which are a physical, operational environment 310, an emulated environment 320, and a mock physical environment 330.

The physical, operational environment 310 comprises a plurality of production LRUs, which comprise production LRUs 315a, 315b, 315c, 315d, 315e, which are hardware devices, such as avionics devices and/or computing devices. In particular, for this example, LRU 315a is a rotary variable differential transformer (RVDT), LRU 315b is a linear variable differential transformer (LVDT), LRU 315c is a thrust lever angle (TLA) sensor, LRU 315d is an angle of attack (AOA) sensor, and LRU 315e is another type of sensor. These LRUs 315a, 315b, 315c, 315d, 315e are production (black label) units that have been tested and certified for use on a vehicle (e.g., an aircraft). For operation of the disclosed system 300, these production LRUs 315a, 315b, 315c, 315d, 315e are installed onto and operational on a vehicle (e.g., an aircraft for this example).

It should be noted that in one or more embodiments, various different types of LRUs may be employed by the disclosed system 300 for the production LRUs other than the types of production LRUs 315a, 315b, 315c, 315d, 315e shown in FIG. 3. In addition, in one or more embodiments, a greater or lesser number of production LRUs may be employed by the disclosed system 300 than the number (i.e. five) of the production LRUs 315a, 315b, 315c, 315d, 315e shown in FIG. 3.

The emulated environment 320 comprises an emulation server 305. The emulation server 305 comprises an electrical equipment rack comprising a plurality of ruggedized server blades 365a, 365b, 365c, 365d, 365e. Each of the blades 365a, 365b, 365c, 365d, 365e comprises a respective emulated LRU (e.g., an emulator) 360a, 360b, 360c, 360d, 360e. The emulated LRUs 360a, 360b, 360c, 360d, 360e are virtual machines that each specifically emulate one of the production LRUs 315a, 315b, 315c, 315d, 315e. For example, emulated LRU 360a emulates production LRU 315a, emulated LRU 360b emulates production LRU 315b, emulated LRU 360c emulates production LRU 315c, emulated LRU 360d emulates production LRU 315d, and emulated LRU 360e emulates production LRU 315e. In one or more embodiments, the emulated LRUs 360a, 360b, 360c, 360d, 360e may also emulate their respective production LRUs' 315a, 315b, 315c, 315d, 315e associated physical interfaces, such as connectivity devices including, but not limited to, switch boards, networking components, and/or interfaces, such as peripherals, data links, interrupt behavior, and timing requirements.

In particular, the emulated LRUs 360a, 360b, 360c, 360d, 360e can emulate the operation of the production LRUs 315a, 315b, 315c, 315d, 315e, which includes the emulation of how specific software (e.g., along with the addition of physical environmental data inputs) executes on the specific type of production LRUs 315a, 315b, 315c, 315d, 315e. In addition, the emulated LRUs 360a, 360b, 360c, 360d, 360e can execute exact, substantially exact, or even different copies of software utilized by the production LRUs 315a, 315b, 315c, 315d, 315e.

For example, in one or more embodiments, experimental software (e.g., algorithms, such as a pre-certified algorithm) can be tested by having at least one of the emulated LRUs 360a, 360b, 360c, 360d, 360e execute the experimental software (e.g., algorithms) while emulating the specific type of production LRUs 315a, 315b, 315c, 315d, 315e. The outputs generated by at least one of the emulated LRUs 360a, 360b, 360c, 360d, 360e after the execution of the experimental software can be analyzed to determine whether the experimental software operated on at least one of the production LRUs 315a, 315b, 315c, 315d, 315e sufficiently (e.g., sufficient enough for the pre-certified algorithm to be certified).

Also, in one or more embodiments, an optional software feature(s) (e.g., a customer option(s)) for at least one of the production LRUs 315a, 315b, 315c, 315d, 315e that was not previously selected and/or purchased by the customer(s) for at least one of the production LRUs 315a, 315b, 315c, 315d, 315e may be run on at least one of the emulator LRUs 360a, 360b, 360c, 360d, 360e emulating at least one of the production LRUs 315a, 315b, 315c, 315d, 315e for evaluation. In one or more embodiments, when at least one of the emulator LRUs 360a, 360b, 360c, 360d, 360e runs the software feature(s) while emulating at least one of the production LRUs 315a, 315b, 315c, 315d, 315e, the software feature(s) is activated to go live, thereby allowing for the customer(s) to experience and evaluate the additional feature(s).

During operation of the disclosed system 300, the emulation server 305 is located and operating on the same vehicle (e.g., an aircraft) as the production LRUs 315a, 315b, 315c, 315d, 315e. In other embodiments, the emulation server 305 is located remote (e.g., at a ground facility, such as 530 of FIG. 5, or on another vehicle) from the vehicle comprising the production LRUs 315a, 315b, 315c, 315d, 315e. It should be noted that although FIG. 3 shows only one emulation server 305, in one or more embodiments, more than one emulation server 305 may be employed by the disclosed system 300. When more than one emulation server 305 is employed by the disclosed system 300, at least one emulation server 305 may be located on the same vehicle as the production LRUs 315a, 315b, 315c, 315d, 315e, and at least one emulation server 305 may be located remote from the vehicle comprising the production LRUs 315a, 315b, 315c, 315d, 315e.

The emulated LRUs 360a, 360b, 360c, 360d, 360e may be substantially smaller and/or lighter than the real production LRUs 315a, 315b, 315c, 315d, 315e and, as such, the emulated LRUs 360a, 360b, 360c, 360d, 360e, when located onboard the vehicle, can provide multiple layers of redundancy to the system 300, while minimizing space and weight on the vehicle that would otherwise be used by hardware devices to provide such redundancy. In addition, the emulated LRUs 360a, 360b, 360c, 360d, 360e can reduce development costs by making virtual hardware devices available at very early stages in a product development and lifecycle, thereby allowing for earlier performance of requirements for development, software development, and testing. The early availability of virtual hardware devices (e.g., the emulated LRUs 360a, 360b, 360c, 360d, 360e) in comparison to real hardware devices also allows for earlier discovery of problems in product requirements and designs.

In addition, the use of the virtual hardware devices (e.g., the emulated LRUs 360a, 360b, 360c, 360d, 360e) can reduce qualification costs by incurring such costs only once for the hardware of the emulation server 305, rather than incurring costs for each hardware device (e.g., each pre-certified LRUs 335a, 335b, 335c, 335d, 335e) emulated by the virtual hardware devices. Further, the emulated LRUs 360a, 360b, 360c, 360d, 360e can greatly reduce costs because they can be implemented on low-cost, generic, and/or commercial off-the-shelf (COTS) hardware, instead of multiple, different, specialized hardware devices (e.g., pre-certified LRUs 335a, 335b, 335c, 335d, 335e).

During operation of the disclosed system 300, at least one of the pre-certified LRUs 335a, 335b, 335c, 335d, 335e is located and operating on the same vehicle (e.g., an aircraft) as the production LRUs 315a, 315b, 315c, 315d, 315e. This allows for the pre-certified LRUs 335a, 335b, 335c, 335d, 335e, while operating, to experience the same environmental conditions (e.g., vibration, radiation, and temperature) as the production LRUs 315a, 315b, 315c, 315d, 315e. In one or more embodiments, at least one of pre-certified LRUs 335a, 335b, 335c, 335d, 335e is located remote (e.g., at a ground facility, such as 530 of FIG. 5, or on another vehicle) from the vehicle comprising the production LRUs 315a, 315b, 315c, 315d, 315e.

It should be noted that, in one or more embodiments, more or less number of emulated LRUs may be employed by the disclosed system 300 than the number (i.e. five) of the emulated LRUs 360a, 360b, 360c, 360d, 360e shown in FIG. 3.

In one or more embodiments, each of the production LRUs 315a, 315b, 315c, 315d, 315e is connected to its respective emulated LRU 360a, 360b, 360c, 360d, 360e, which is located within the emulator server 305. In particular, each of the production LRUs 315a, 315b, 315c, 315d, 315e is connected to the emulator server 305 via at least one input connector 340a, 340b, 340c, 340d and an input patch panel 345. Various different types of connectors may be employed for the input connectors 340a, 340b, 340c, 340d of the disclosed system 300 including, but not limited to, an Aeronautical Radio Incorporated (ARINC) 600 connector, a Quadrax connector, an ARINC 429/628 connector, or a universal serial bus (USB) port.

It should be noted that the connection of the production LRUs 315a, 315b, 315c, 315d, 315e to the emulator server 305 only allows for a one-way transfer of data (e.g., the input connectors 340a, 340b, 340c, 340d and/or input patch panel

345 operate as a data diode) from the production LRUs 315a, 315b, 315c, 315d, 315e to the emulator server 305, thereby preventing the emulated LRUs 360a, 360b, 360c, 360d, 360e and/or the pre-certified LRUs 335a, 335b, 335c, 335d, 335e from transmitting any data and/or commands to the production LRUs 315a, 315b, 315c, 315d, 315e. This one-way transfer of data ensures that no data corruption or adverse effects will be presented to the certified production LRUs 315a, 315b, 315c, 315d, 315e on the vehicle.

The mock physical environment 330 is shown to comprise a plurality of pre-certified LRUs, which comprise pre-certified LRUs 335a, 335b, 335c, 335d, 335e. In particular, for this example, LRU 335a is a RVDT, LRU 335b is a LVDT, LRU 335c is a TLA sensor, LRU 335d is an AOA sensor, and LRU 335e is another type of sensor. These LRUs 335a, 335b, 335c, 335d, 335e are pre-certified (i.e. red label or blue label) units that have not been certified for use on a vehicle (e.g., an aircraft). For operation of the disclosed system 300, these pre-certified LRUs 335a, 335b, 335c, 335d, 335e are installed onto and operational on a vehicle (e.g., an aircraft for this example). In other embodiments, these pre-certified LRUs 335a, 335b, 335c, 335d, 335e are located remote (e.g., at a ground facility, such as 530 of FIG. 5, or on another vehicle) from the vehicle comprising the production LRUs 315a, 315b, 315c, 315d, 315e.

In one or more embodiments, an optional software feature (s) (e.g., a customer option(s)) for at least one of the production LRUs 315a, 315b, 315c, 315d, 315e that was not previously selected and/or purchased by the customer(s) for at least one of the production LRUs 315a, 315b, 315c, 315d, 315e may be run on at least one of the pre-certified LRUs 335a, 335b, 335c, 335d, 335e for evaluation. In one or more embodiments, when at least one of the pre-certified LRUs 335a, 335b, 335c, 335d, 335e runs the software feature(s), the software feature(s) is activated to go live, thereby allowing for the customer(s) to experience and evaluate the additional feature(s).

It should be noted that, in one or more embodiments, more or less number of pre-certified LRUs may be employed by the disclosed system 300 than the number (i.e. five) of the pre-certified LRUs 335a, 335b, 335c, 335d, 335e shown in FIG. 3.

In one or more embodiments, each of the pre-certified LRUs 335a, 335b, 335c, 335d, 335e is connected to its respective emulated LRU 360a, 360b, 360c, 360d, 360e, which is located within the emulator server 305. In particular, each of the pre-certified LRUs 335a, 335b, 335c, 335d, 335e is connected to the emulator server 305 via at least one output connector 350a, 350b, 350c, 350d and an input patch panel 355. Various different types of connectors may be employed for the output connectors 350a, 350b, 350c, 350d of the disclosed system 300 including, but not limited to, an ARINC 600 connector, a Quadrax connector, an ARINC 429/628 connector, or a USB port.

In one or more embodiments, the disclosed system 300 for operating in an emulated environment operates as follows. During operation, the production LRUs 315a, 315b, 315c, 315d, 315e, which are located on a vehicle (e.g., an aircraft), operate in a physical, operational environment (e.g., operate during flight of the vehicle). While the production LRUs 315a, 315b, 315c, 315d, 315e are operating, the production LRUs 315a, 315b, 315c, 315d, 315e obtain (e.g., sense) physical environmental information (e.g., an AOA sensor senses an angle of attack). After the production LRUs 315a, 315b, 315c, 315d, 315e obtain the physical environmental information, the production LRUs 315a, 315b, 315c, 315d, 315e will generate and output physical environmental data (e.g., the sensed data, such as 1.2 volts) based on the obtained physical environmental information. The production LRUs 315a, 315b, 315c, 315d, 315e will also generate and output production LRU output data (e.g., data indicating a 45 degrees angle of attack) based on the obtained physical environmental information. Also, during operation of the disclosed system 300, the emulated LRUs 360a, 360b, 360c, 360d, 360e are emulating the operation of the production LRUs 315a, 315b, 315c, 315d, 315e.

After the production LRUs 315a, 315b, 315c, 315d, 315e generate and output the production LRU output data and the physical environmental data, the production LRUs 315a, 315b, 315c, 315d, 315e transmit the production LRU output data (e.g., data indicating a 45 degrees angle of attack) and the physical environmental data (e.g., data indicating 1.2 volts) to the emulated LRUs 360a, 360b, 360c, 360d, 360e (i.e. emulators) in the emulator server 305 via the input connectors 340a, 340b, 340c, 340d and the input patch panel 345. It should be noted that, in one or more embodiments, the production LRU output data (e.g., data indicating a 45 degrees angle of attack) and the physical environmental data (e.g., data indicating 1.2 volts) use LRU data protocols.

After the emulated LRUs 360a, 360b, 360c, 360d, 360e receive the production LRU output data (e.g., data indicating a 45 degrees angle of attack) and the physical environmental data (e.g., data indicating 1.2 volts), in one or more embodiments, the emulated LRUs 360a, 360b, 360c, 360d, 360e in the emulator server 305 translate the production LRU output data (e.g., data indicating a 45 degrees angle of attack) and the physical environmental data (e.g., data indicating 1.2 volts), which use LRU data protocols, to production LRU output data (e.g., data indicating a 45 degrees angle of attack) and the physical environmental data (e.g., data indicating 1.2 volts) using emulator protocols.

Then, the emulated LRUs 360a, 360b, 360c, 360d, 360e, while emulating the production LRUs 315a, 315b, 315c, 315d, 315e, generate and output a model of the operational environment of the vehicle by using the physical environmental data (e.g., data indicating 1.2 volts) using the emulator protocols. It should be noted that, in one or more embodiments, the generated model of the operational environment uses emulator protocols.

After the emulated LRUs 360a, 360b, 360c, 360d, 360e generate the model of the operational environment, in one or more embodiments, the emulated LRUs 360a, 360b, 360c, 360d, 360e in the emulator server 305 translate the model of the operational environment, which uses emulator protocols, to a model of the operational environment using LRU data protocols. The emulated LRUs 360a, 360b, 360c, 360d, 360e transmit the model of the operational environment (using the LRU data protocols) to the pre-certified LRUs 335a, 335b, 335c, 335d, 335e via the output patch panel 355 and at least one output connector 350a, 350b, 350c, 350d.

After the pre-certified LRUs 335a, 335b, 335c, 335d, 335e receive the model of the operational environment, the pre-certified LRUs 335a, 335b, 335c, 335d, 335e generate and output pre-certified output data (e.g., data indicating a 43 degrees angle of attack) by using the model of the operational environment. The pre-certified LRUs 335a, 335b, 335c, 335d, 335e transmit the pre-certified output data to the emulated LRUs 360a, 360b, 360c, 360d, 360e in the emulator server 305 via and at least one output connector 350a, 350b, 350c, 350d and the output patch panel 355.

After the emulated LRUs 360a, 360b, 360c, 360d, 360e receive the pre-certified output data, at least one processor (which may be located in at least one of the emulated LRUs 360a, 360b, 360c, 360d, 360e) compares the pre-certified output data (e.g., data indicating a 43 degrees angle of attack) to the production LRU output data (e.g., data indicating a 45 degrees angle of attack) to generate comparison data (e.g., data indicating a 2 degrees difference in the angle of attack). Then, the comparison data is stored (e.g., in at least one of the emulated LRUs 360a, 360b, 360c, 360d, 360e). The comparison data is evaluated (e.g., either by itself or along with other data) to determine whether at least one of the pre-certified LRUs 335a, 335b, 335c, 335d, 335e (e.g., AOA production LRU 315d) is operating within pre-determined tolerances to be certified as a production LRU.

In addition, in one or more embodiments, the emulated LRUs 360a, 360b, 360c, 360d, 360e of the disclosed system 300 generate a model of behavior of the vehicle (e.g., the aircraft) by using the generated model of the operational environment. For these embodiments, the operation of at least one of the emulated LRUs 360a, 360b, 360c, 360d, 360e is optimized (e.g., an algorithm of at least one of the emulated LRUs 360a, 360b, 360c, 360d, 360e is optimized) by using at least one model of behavior of the vehicle(s). In one or more embodiments, the models of behavior of the vehicle(s) may be obtained by the emulated LRUs 360a, 360b, 360c, 360d, 360e on the vehicle during one or more flights of the vehicle and/or by the emulated LRUs 360a, 360b, 360c, 360d, 360e on different vehicles (e.g., of a same model as the vehicle or different models of the vehicle) during one or more flights of the different vehicles.

In one or more embodiments, the optimizing of the operation of at least one of the emulated LRUs 360a, 360b, 360c, 360d, 360e (e.g., optimizing an algorithm(s) of at least one of the emulated LRUs 360a, 360b, 360c, 360d, 360e running on the LRU(s) 360a, 360b, 360c, 360d, 360e) comprises applying machine learning (e.g., using association rule-learning and/or inductive logic programming) to a training dataset comprising a plurality of models of behavior of the vehicle(s). Machine learning is an application of artificial intelligence (AI) that provides systems the ability to automatically learn and improve from experience without being explicitly programmed. As such, a training dataset (e.g., a mathematical model of flight data, such as the behavior of the vehicle(s) during flight(s)) is used to run at least one of emulated LRUs 360a, 360b, 360c, 360d, 360e (e.g., run an algorithm(s) of at least one of the emulated LRUs 360a, 360b, 360c, 360d, 360e on at least one of the emulated LRUs 360a, 360b, 360c, 360d, 360e) to evaluate performance of the emulated LRU(s) 360a, 360b, 360c, 360d, 360e (e.g., evaluate the performance of the algorithm(s) running on the emulated LRU(s) 360a, 360b, 360c, 360d, 360e).

Machine learning using association rule-learning discovers the relationship between variables (e.g., the relationship between LRU (sensor) data, such as production LRU output data, and different vehicle behaviors) in large databases, and may use classifier systems and employ feature extraction. Machine learning using inductive logic programming is a subfield of symbolic artificial intelligence, which uses logic programming as a uniform representation of background knowledge and hypotheses. Given an encoding of the known background knowledge and a set of examples represented as a logical database of facts (e.g., specific LRU (sensor) data is known to cause certain vehicle behaviors), an inductive logic programming system will derive a hypothesized logic program, which entails all the positive and none of the negative examples. In other words, learning is addressed from typically declarative and often recursive programs from incomplete specifications in a prototype flight system, such as input/output constraints. This approach is represented as schema: positive example plus (+) negative examples+background knowledge forms a hypothesis.

Figure 4:
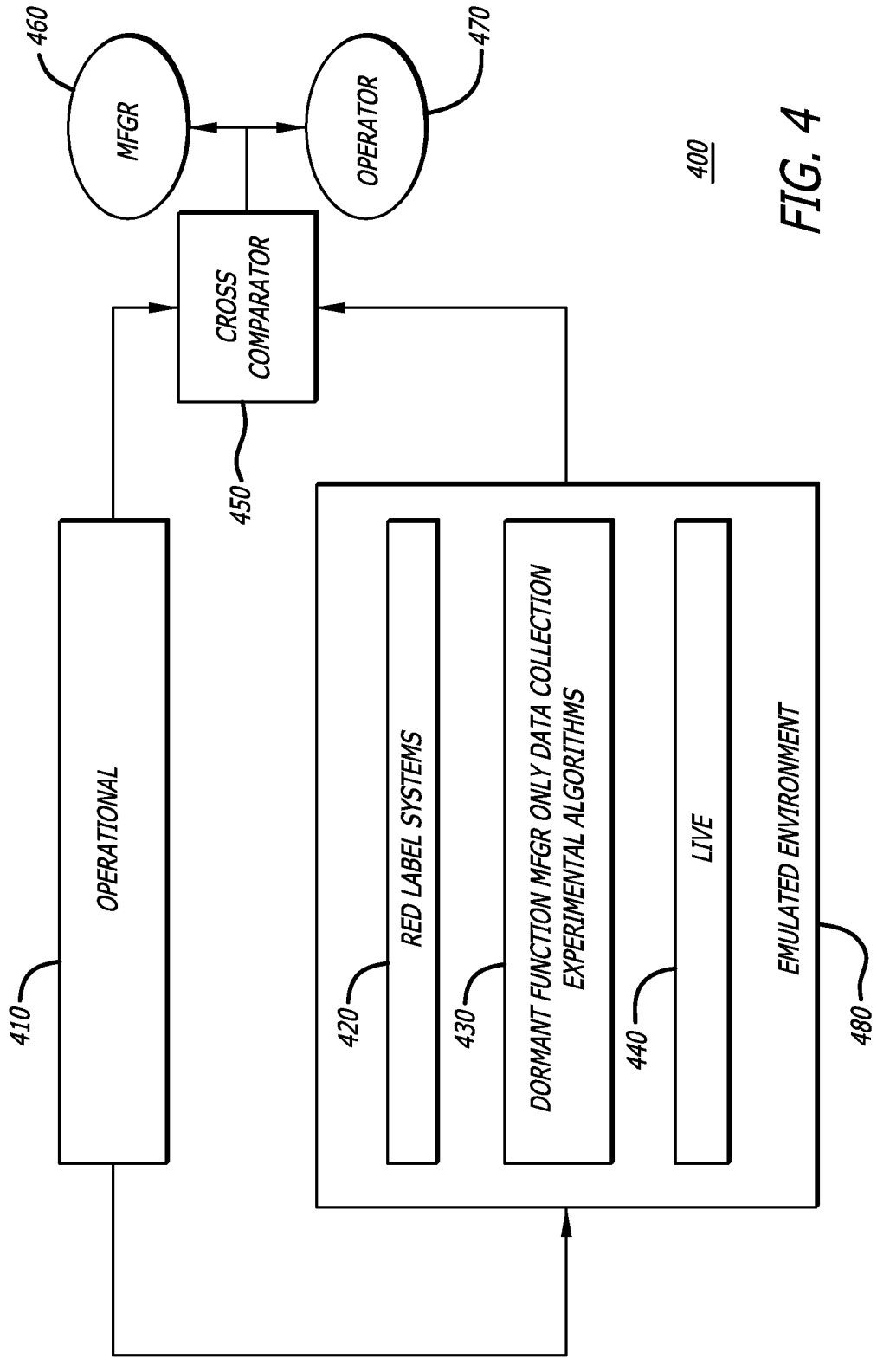
FIG. 4 is flow chart showing the disclosed emulation method for the disclosed system for operating in an emulated environment, in accordance with at least one embodiment of the present disclosure.

FIG. 4 is flow chart showing the disclosed emulation method (algorithm) 400 for the disclosed system for operating in an emulated environment, in accordance with at least one embodiment of the present disclosure. At the start of the method 400, production LRUs (e.g., black label LRUs), operating in the physical operational environment (e.g., refer to 310 of FIG. 3), generate and output physical environmental data and production LRU output data at step 410.

Then, at step 480, the physical environmental data and/or production LRU output data are applied to at least one of three different functions. For the first function, at step 420, red label (e.g., pre-certified LRUs), which correspond to the production LRUs, generate pre-certified LRU output data by using the physical environmental data from the production LRUs. Then, at step 450, the pre-certified LRU output data is compared to the production LRU output data to generate comparison data. Then, a manufacturer of the production LRU may review the comparison data at step 460 and/or an operator of the vehicle comprising the production LRUs may review the comparison data at step 470 to determine whether the pre-certified LRUs operated within predetermined certification tolerances.

For the second function, at step 430, an experimental algorithm (which is normally dormant) may be run on emulators emulating the production LRUs. During the running of the experimental algorithm, the emulators generate and output emulator output data by using the physical environmental data and/or the production LRU output data. Then, at step 450, the emulator output data is compared to the production LRU output data to generate comparison data. Then, a manufacturer of the production LRU may review the comparison data at step 460 and/or an operator of the vehicle comprising the production LRUs may review the comparison data at step 470 to determine whether the experimental algorithm should be revised.

For the third function, at step 440, an optional feature (e.g., a customer option) for the production LRUs may go live by being run on the emulators emulating the production LRUs. During the running of the optional feature, the emulators generate and output emulator output data by using the physical environmental data and/or the production LRU output data. At step 450, the emulator output data is compared to the production LRU output data to generate comparison data. Then, a manufacturer of the production LRU may review the comparison data at step 460 and/or an operator of the vehicle comprising the production LRUs may review the comparison data at step 470 to determine whether the optional feature operated satisfactorily.

FIGS. 5-9 depict various exemplary operating scenarios for the disclosed systems 500, 600, 700, 800, 900 for operating an in emulated environment employing cloning and, optionally, containerization. Cloning involves employing clone (e.g., mirror copies) of the virtual components (e.g., emulated LRUs, such as emulated LRUs 560a, 560b, 560c, 560d, 560e of FIG. 3) and/or software (e.g., the software (or algorithms) run on the emulated LRUs).

Figure 10:
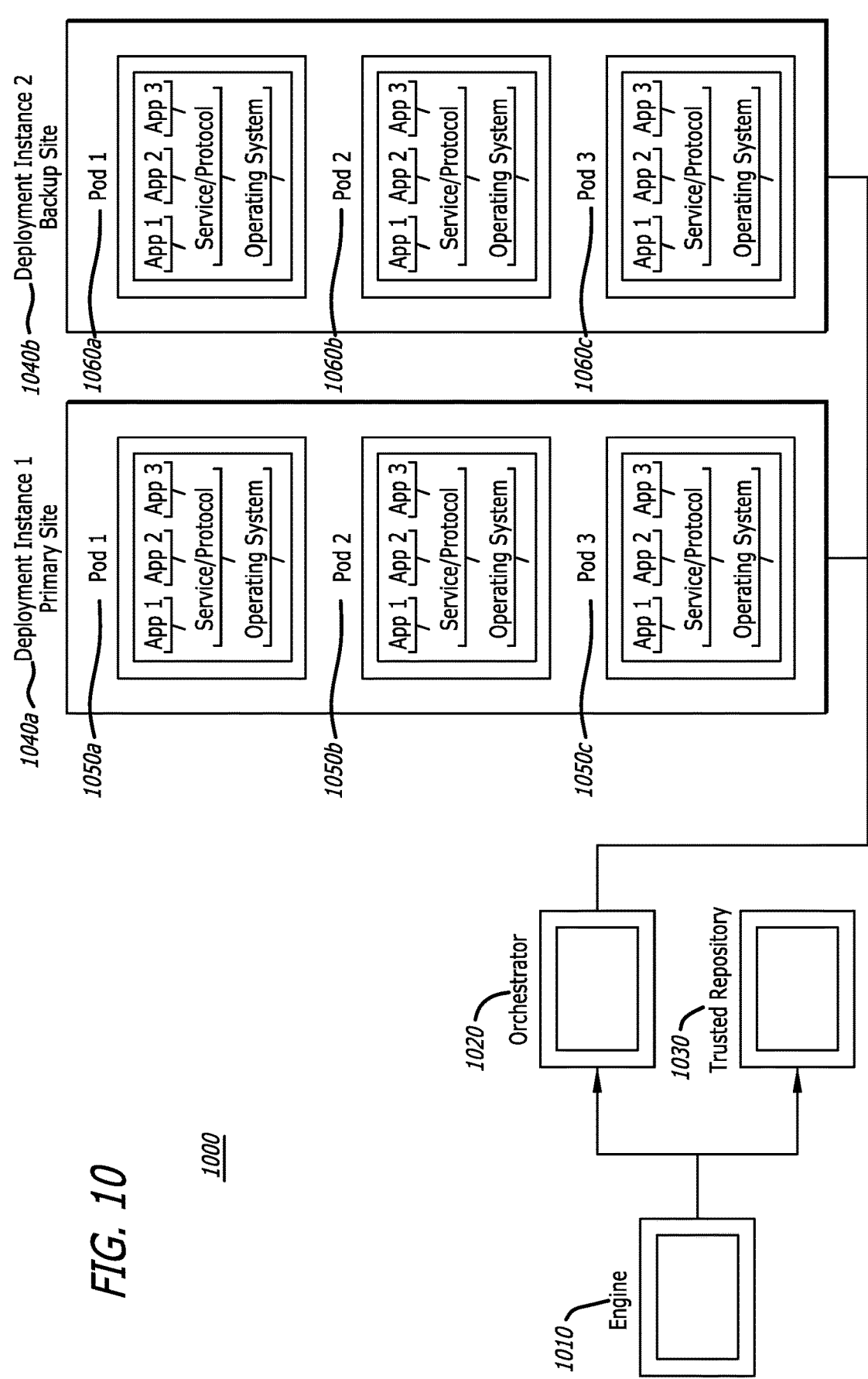
FIG. 10 is a block diagram showing an exemplary containerization system, which may be employed by the disclosed system for operating an in emulated environment, in accordance with at least one embodiment of the present disclosure.

Containerization involves encapsulating (or packaging up) software code (e.g., for the virtual components and/or software) and all its dependencies so that it can run uniformly and consistently on any infrastructure. Containerization allows for the creation and deployment of applications (e.g., virtual components and software) faster and more securely than using traditional methods because the single package of software or "container" is abstracted away (i.e.

isolated) from the host operating system (as well as isolated from the other containers), and hence, it stands alone and becomes portable, thereby able to run across any platform or cloud, free of any issues. There is no limit to the number of containers that can be hosted. One service (e.g., a containerized emulated LRU) can be hosted countless times over and replicated (e.g., a clone containerized emulated LRU(s)) in different geographical regions. The operation of the containers is orchestrated such that the containers can run simultaneously together or at different times. It should be noted that the description of FIG. 10 provides details of an exemplary containerization system that may be employed by the disclosed systems 300, 500, 600, 700, 800, 900 for operating an in emulated environment.

For FIGS. 5-9, the systems 500, 600, 700, 800, 900 may comprise clone emulated LRUs (i.e. clone emulators), which are mirrored copies (or clones) of the emulated LRUs (e.g., refer to emulated LRUs 560*a*, 560*b*, 560*c*, 560*d*, 560*e* of FIG. 3) on the vehicle. In one or more embodiments, the clone emulated LRUs are located remote from and/or on the vehicle that comprises the emulated LRUs. Also, for these figures, the systems 500, 600, 700, 800, 900 may comprise clone LRU algorithms, which are mirrored copies (e.g., exact or substantially exact copies) (or clones) of the algorithms run on the emulated LRU(s) on the vehicle. In one or more embodiments, the clone LRU algorithms are run on the clone emulated LRUs.

Also for these figures, containerization may be applied to at least one of the emulated LRUs (e.g., refer to emulated LRUs 560*a*, 560*b*, 560*c*, 560*d*, 560*e* of FIG. 3) on the vehicle, at least one of the clone emulated LRUs, at least one of the LRU algorithms (e.g., algorithms run on the emulated LRUs on the vehicle), and/or at least one of the clone LRU algorithms.

In one or more embodiments, the containerized emulated LRUs (i.e. containerized emulators) are located within an emulation server (e.g., refer to emulation server 305 of FIG. 3) located on the vehicle, within an emulation server located remote from the vehicle, and/or within a server (e.g., a generic server) located remote from the vehicle. In some embodiments, the clone containerized emulated LRUs (i.e. clone containerized emulators) are located and operating remote from and/or on the vehicle comprising the containerized emulated LRUs (i.e. the containerized emulators).

In at least one embodiment, the containerized emulated LRUs (i.e. containerized emulators) are isolated from each other and/or are isolated from the clone containerized emulated LRUs (i.e. clone containerized emulators). In some embodiments, the clone containerized emulated LRUs (i.e. clone containerized emulators) are isolated from each other and/or are isolated from the containerized emulated LRUs (containerized emulators).

In one or more embodiments, the containerized LRU algorithms are isolated from each other and/or isolated from the clone containerized LRU algorithms. In some embodiments, the clone containerized LRU algorithms are isolated from each other and/or isolated from the containerized LRU algorithms.

In one or more embodiments, for FIGS. 5-9, during operation, at least one of the containerized emulated LRUs (e.g., which may be located on the vehicle) emulates at least one of the production LRUs (e.g., which may be located on the vehicle) by running at least one of the containerized LRU algorithms associated with at least one of the production LRUs. Also, at least one of the clone containerized emulated LRUs (e.g., which may be located remote from the vehicle) emulates at least one of the production LRUs (e.g., which may be located on the vehicle) by running at least one of the clone containerized LRU algorithms associated with at least one of the production LRUs.

In one or more embodiments, at least one of the clone containerized emulated LRUs is a clone of at least one of the containerized emulated LRUs. In some embodiments, at least one of the clone containerized LRU algorithms is a clone of at least one of the containerized LRU algorithms.

In some embodiments, the emulating by at least one of the containerized emulated LRUs and the emulating by at least one of the clone containerized emulated LRUs occurs simultaneously. In at least one embodiment, at least one of the containerized emulated LRUs (and/or at least one of the clone containerized emulated LRUs) runs at least one of the clone containerized LRU algorithms to provide redundancy (e.g., provide redundancy on the vehicle).

Figure 5:
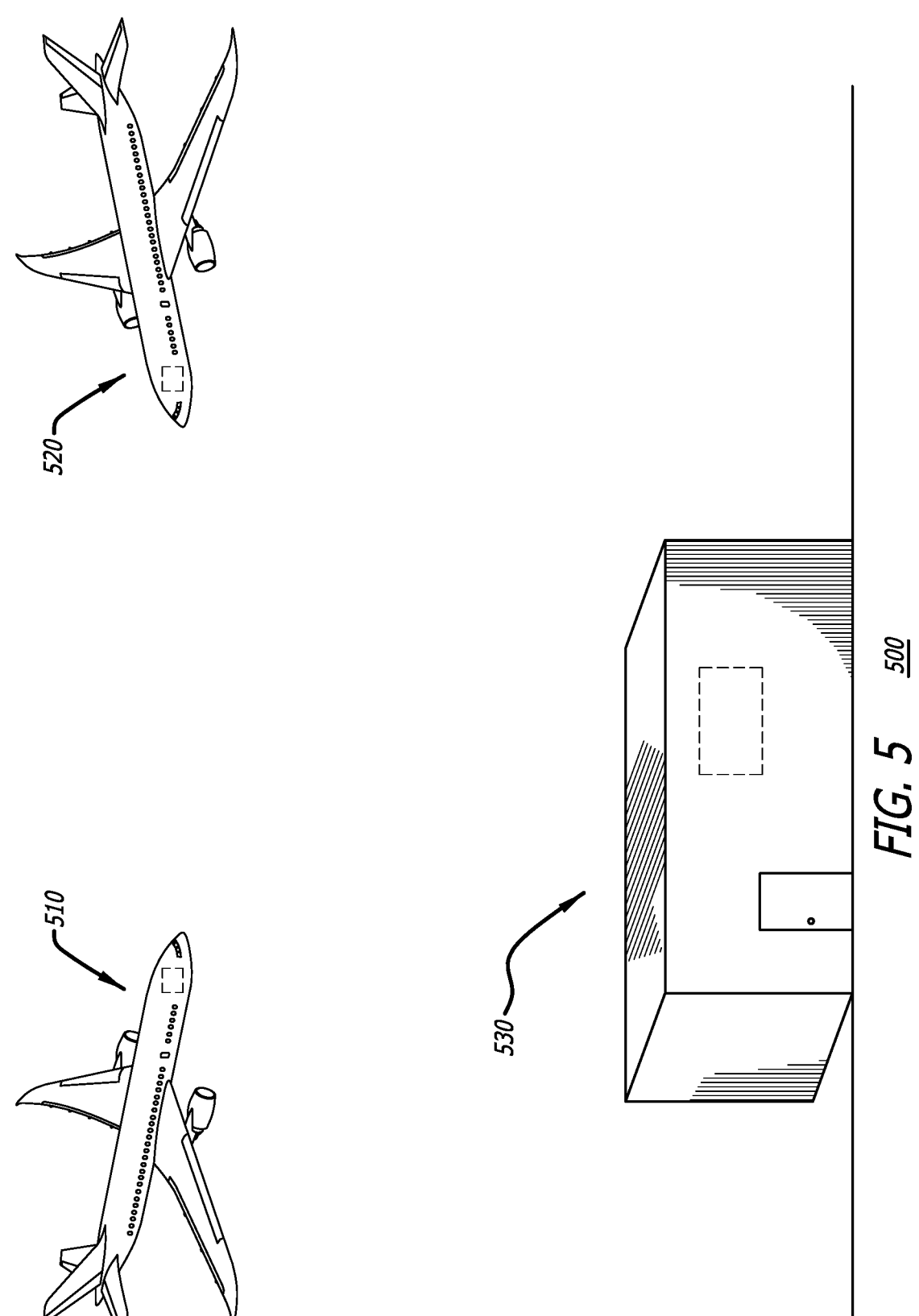
FIG. 5 is a diagram showing the disclosed system for operating an in emulated environment comprising a primary aircraft, a secondary aircraft, and a ground facility, in accordance with at least one embodiment of the present disclosure.

FIG. 5 is a diagram showing the disclosed system 500 for operating an in emulated environment comprising a primary aircraft 510, a secondary aircraft 520, and a ground facility 530, in accordance with at least one embodiment of the present disclosure. In this figure, the primary aircraft 510 contains containerized emulated LRUs (e.g., refer to emulated LRUs 360*a*, 360*b*, 360*c*, 360*d*, 360*e* in FIG. 3) in an emulation server (e.g., refer to emulation server 305 in FIG. 3). The containerized emulated LRUs on the primary aircraft 510 are configured to comprise a specific configuration (e.g., Configuration A).

The secondary aircraft 520 and the ground facility (e.g., a ground station or operations center) 530 both comprise clone containerized emulated LRUs, which are clones of the containerized emulated LRUs on the primary aircraft 510. The clone containerized emulated LRUs on the secondary aircraft 520 are configured to comprise a different configuration (e.g., Configuration B), and the clone containerized emulated LRUs at the ground facility 530 comprise another configuration (e.g., Configuration C).

For example, the containerized emulated LRUs on the primary aircraft 510 are configured (e.g., Configuration A) such that the flight attendants can control some of the cabin services (e.g., cabin temperature, lighting, entertainment services, etc.). And, the clone containerized emulated LRUs on the secondary aircraft 520 are configured (e.g., Configuration B) such that all of the cabin services are pre-programmed and the flight attendants do not have access to alter them. As such, for these example configurations, the secondary aircraft 520 would not comprise clone containerized emulated LRUs that are clones of the containerized emulated LRUs on the primary aircraft 510 that allow the flight attendants to control the cabin services.

During operation, the containerized emulated LRUs on the primary aircraft 510 run containerized LRU algorithms. And, the clone containerized emulated LRUs on the secondary aircraft 520 and the ground facility 530 run clone containerized LRU algorithms, which are clones of the containerized LRU algorithms running on the containerized emulated LRUs on the primary aircraft 510. The results from the running of the containerized LRU algorithms can be compared (e.g., compared in real time) to analyze the differences in running on these three different platforms (e.g., the different environments).

In particular, for example, during operation, production LRUs (e.g., refer to production LRUs 315*a*, 315*b*, 315*c*, 315*d*, 315*e* of FIG. 3) operating in a physical, operational environment on the primary aircraft 510 obtain physical environmental information, and generate and output production LRU output data by using the physical environmental information. The containerized emulated LRUs (e.g., refer to emulated LRUs 360a, 360b, 360c, 360d, 360e in FIG. 3) in an emulation server (e.g., refer to emulation server 305 in FIG. 3) on the primary aircraft 510 emulate the production LRUs by running a containerized algorithm(s) associated with the production LRUs (e.g., by using the production LRU output data and/or physical environmental data based on the physical environmental information). Also, the clone containerized emulated LRUs (e.g., on the secondary aircraft 520 and the ground facility 530) emulate the production LRUs by running a clone containerized algorithm(s) (which is a clone of the containerized algorithm(s)) associated with the production LRUs) (e.g., using the production LRU output data and/or the physical environmental data).

Then, a comparator (e.g., within at least one of the containerized emulated LRUs and/or at least one of the clone containerized emulated LRUs) compares, to identify differences, the output data generated from the containerized emulated LRUs on the primary aircraft 510, the output data generated from the clone containerized emulated LRUs on the secondary aircraft 520, and the output data generated from the clone containerized emulated LRUs at the ground facility 530. Then, at least one of the clone containerized algorithms (e.g., run on the clone containerized emulated LRUs on the secondary aircraft 520 and/or the ground facility 530) is updated according to the differences.

Figure 6:
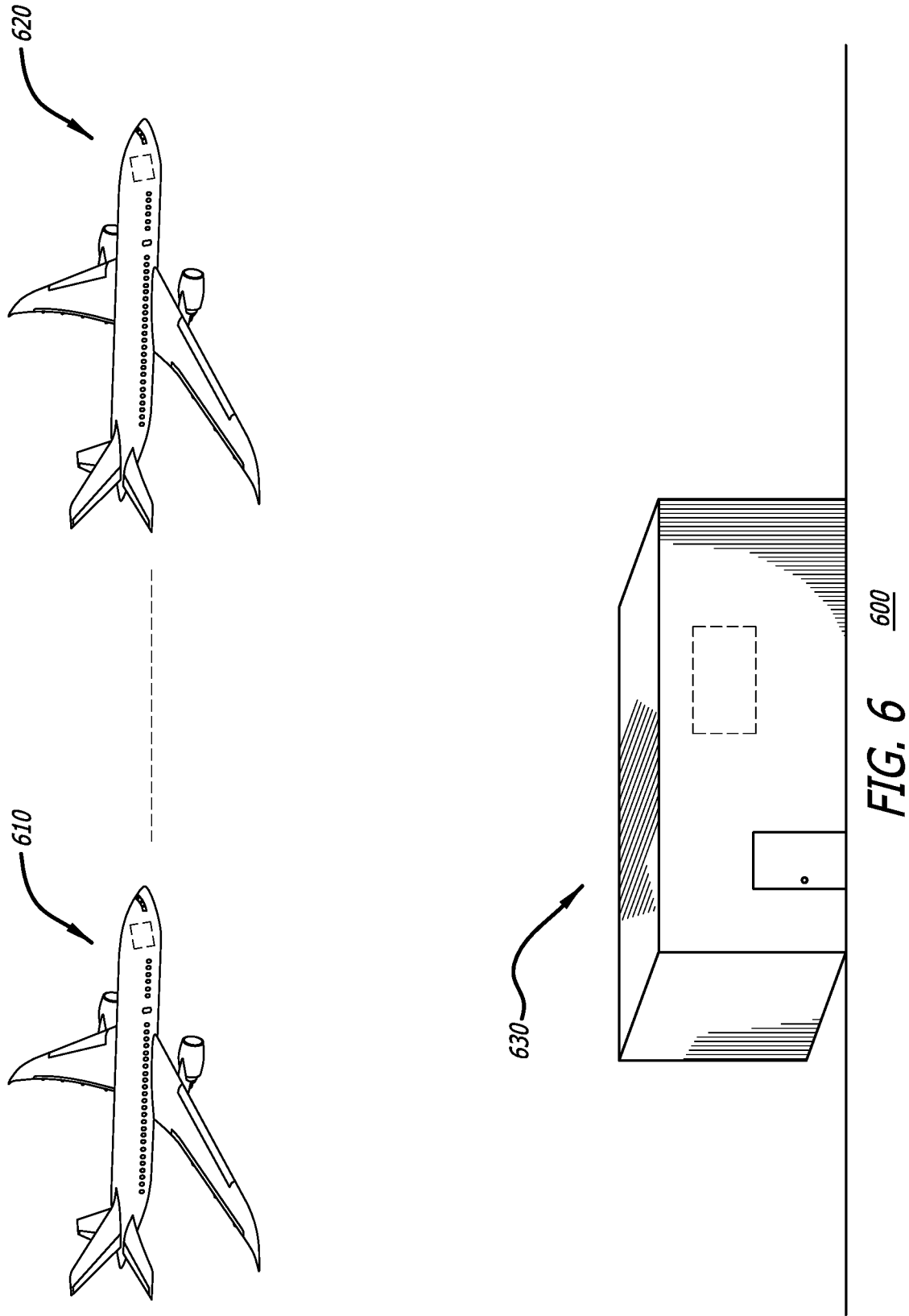
FIG. 6 is a diagram showing the disclosed system for operating an in emulated environment comprising a primary aircraft, a secondary aircraft, and a ground facility, where the secondary aircraft is following the primary aircraft on a same flight path, in accordance with at least one embodiment of the present disclosure.

FIG. 6 is a diagram showing the disclosed system 600 for operating an in emulated environment comprising a primary aircraft 610, a secondary aircraft 620, and a ground facility 630, where the secondary aircraft 620 is following the primary aircraft 610 on a same flight path, in accordance with at least one embodiment of the present disclosure. In this figure, the primary aircraft 610 contains containerized emulated LRUs (e.g., refer to emulated LRUs 360a, 360b, 360c, 360d, 360e in FIG. 3) in an emulation server (e.g., refer to emulation server 305 in FIG. 3). The secondary aircraft 620 and the ground facility (e.g., a ground station or operations center) 630 both comprise clone containerized emulated LRUs, which are clones of the containerized emulated LRUs on the primary aircraft 610. The containerized emulated LRUs on the primary aircraft 610, the clone containerized emulated LRUs on the secondary aircraft 620, and the clone containerized emulated LRUs at the ground facility 530 all comprise the same configuration.

During operation, for example, the primary aircraft 610 may experience problematic weather. During this time, the containerized emulated LRUs (running a containerized algorithm(s)) on the primary aircraft 610 obtain information regarding the problematic weather (e.g., flight data). That information (e.g., flight data) is instantaneously available to and received by the clone containerized emulated LRUs (running a clone containerized algorithm(s)) on the secondary aircraft 620, which is on the same flight path as the primary aircraft 610, as well as to the clone containerized emulated LRUs (running a clone containerized algorithm(s)) at the ground facility 630. In response, the clone containerized emulated LRUs on the secondary aircraft 620 can apply variables from the gathered information regarding the weather to the clone containerized algorithm(s) to adjust the behavior of the secondary aircraft 620 accordingly and/or to update the clone containerized algorithm(s) according to the flight data. Also, the ground facility 630 can use the information to update modeling software (e.g., update the clone containerized algorithm(s) according to the flight data), and share the information with a fleet of aircraft and advisory groups (e.g., Federal Aviation Administration (FAA)). For example, real time analytics can help airlines monitor fuel burn for an entire fleet, and make adjustments (e.g., update the clone containerized algorithm(s)) fleet wide.

Figure 7:
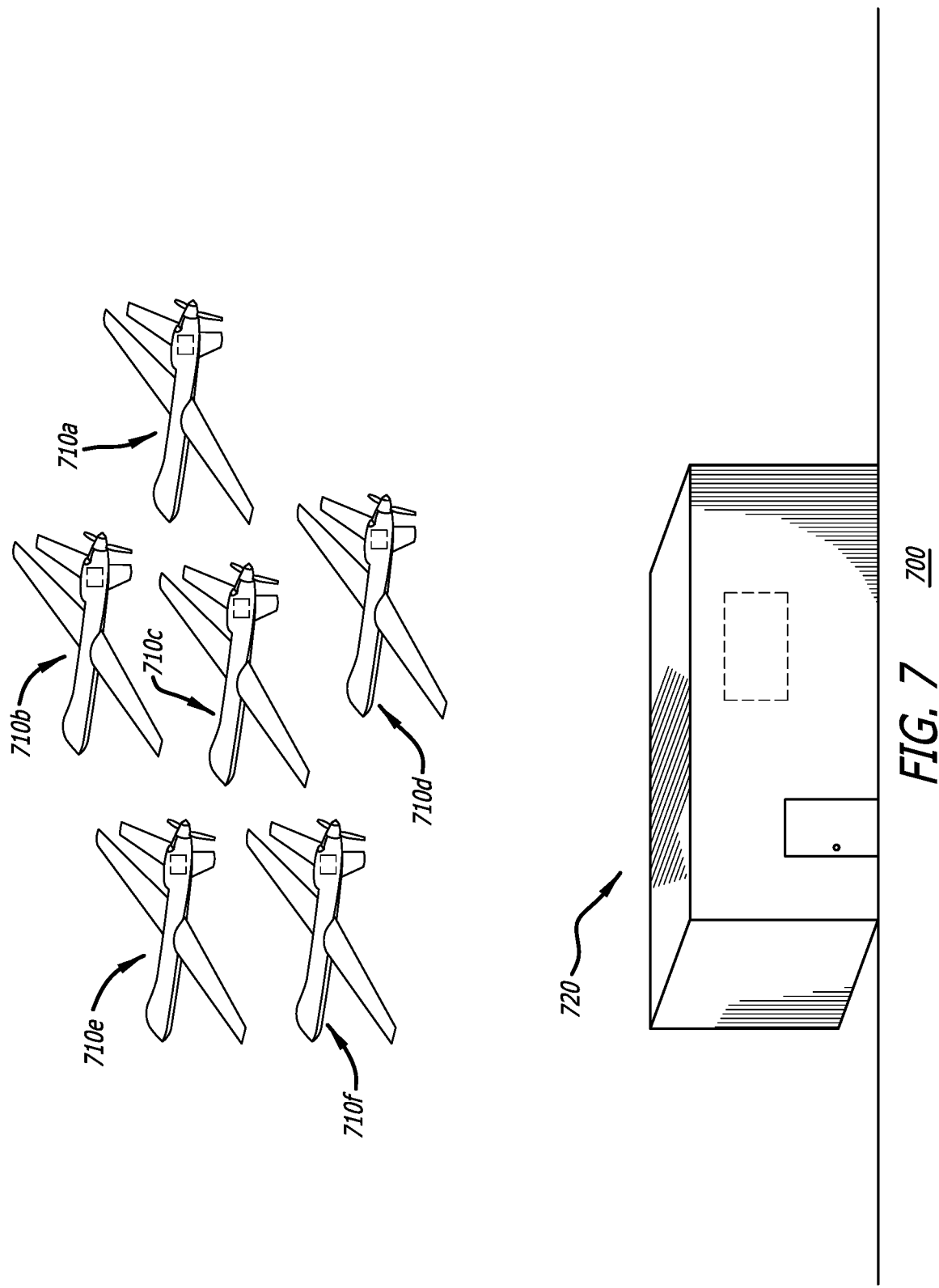
FIG. 7 is a diagram showing the disclosed system for operating an in emulated environment comprising a hive of aircraft and a ground facility, in accordance with at least one embodiment of the present disclosure.

FIG. 7 is a diagram showing the disclosed system 700 for operating an in emulated environment comprising a hive of aircraft 710a, 710b, 710c, 710d, 710e, 710f and a ground facility 720, in accordance with at least one embodiment of the present disclosure. In this figure, the aircraft 710a, 710b, 710c, 710d, 710e, 710f are flying autonomously in a tight formation (e.g., proximate one another). One of the aircraft 710a (e.g., a primary aircraft) comprises containerized emulated LRUs (e.g., refer to emulated LRUs 360a, 360b, 360c, 360d, 360e in FIG. 3) in an emulation server (e.g., refer to emulation server 305 in FIG. 3). The remaining aircraft 710b, 710c, 710d, 710e, 710f comprise clone containerized emulated LRUs, which are clones of the containerized emulated LRUs on the primary aircraft 710a.

For this figure, during operation, flight data (e.g., environmental data) is shared amongst the containerized emulated LRUs on the primary aircraft 710a and the clone containerized emulated LRUs on at least one of the other aircraft 710b, 710c, 710d, 710e, 710f. In some embodiments, at least one individual aircraft (e.g., aircraft 710b) may have a new system update (e.g., at least one clone containerized LRU algorithm is updated) while in flight to meet mission needs.

Figure 8:
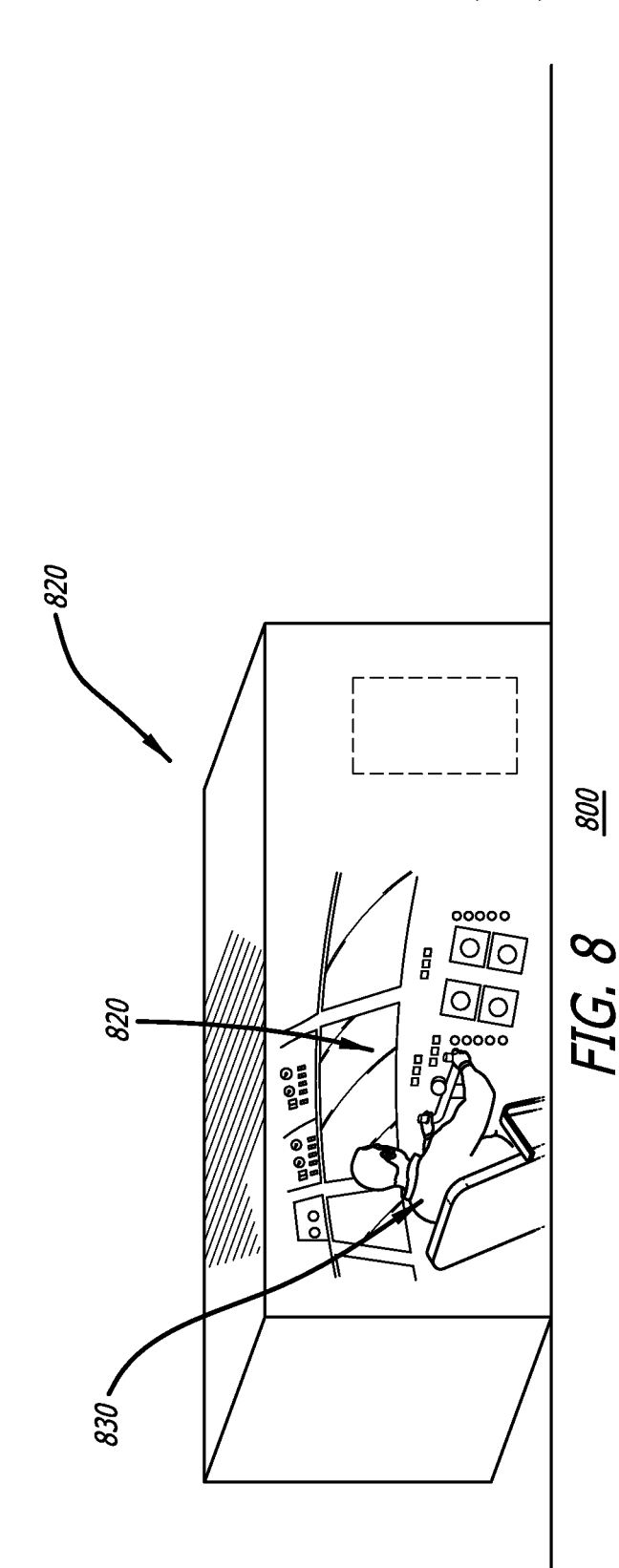
FIG. 8 is a diagram showing the disclosed system for operating an in emulated environment comprising an aircraft and a ground facility comprising a flight simulator being used by a user, in accordance with at least one embodiment of the present disclosure.

FIG. 8 is a diagram showing the disclosed system 800 for operating an in emulated environment comprising an aircraft 810 and a ground facility 820 comprising a flight simulator 820 being used by a user (e.g., a trainee) 830, in accordance with at least one embodiment of the present disclosure. In this figure, the aircraft 810 contains containerized emulated LRUs (e.g., refer to emulated LRUs 360a, 360b, 360c, 360d, 360e in FIG. 3) in an emulation server (e.g., refer to emulation server 305 in FIG. 3). And, the flight simulator 820 comprises clone containerized emulated LRUs, which are clones of the containerized emulated LRUs on the aircraft 810.

For this example, during operation, flight data (e.g., environmental data) is shared by the containerized emulated LRUs on the aircraft 810 with the clone containerized emulated LRUs on the flight simulator 820. The clone containerized emulated LRUs on the flight simulator 820 can store the flight data, and re-run the flight data (e.g., on a clone containerized LRU algorithm(s)) later to allow for a user (e.g., a trainee) 830 on the ground to experience precisely (e.g., a life-like experience) what the pilot of the aircraft 810 experienced when flying the aircraft 810.

FIG. 9 is a diagram showing the disclosed system 900 for operating an in emulated environment comprising an aircraft 910 and a ground facility 920 comprising a laboratory being used by a user (e.g., an engineer) 940, in accordance with at least one embodiment of the present disclosure. In this figure, the aircraft 910 contains containerized emulated LRUs (e.g., refer to emulated LRUs 360a, 360b, 360c, 360d, 360e in FIG. 3), which run at least one containerized LRU algorithm, in an emulation server (e.g., refer to emulation server 305 in FIG. 3). And, the laboratory comprises clone containerized emulated LRUs 930, which are clones of the containerized emulated LRUs on the aircraft 910 and which run at least one clone containerized LRU algorithm.

For this example, during operation, flight data (e.g., environmental data) is shared (e.g., via a one-way transfer of data) by the containerized emulated LRUs on the aircraft 910 with the clone containerized emulated LRUs 930 at the laboratory. The clone containerized emulated LRUs 930 at the laboratory can use the flight data for the further development and/or integration of the containerized emulated LRUs and/or the containerized LRU algorithm(s). This promotes the concept of model-based development, which does not introduce any impact to the aircraft 910 platform.

FIG. 10 is a block diagram showing an exemplary containerization system 1000, which may be employed by the disclosed system for operating an in emulated environment, in accordance with at least one embodiment of the present disclosure. In this figure, the system 1000 is shown to comprise an engine 1010, an orchestrator 1020, a trusted repository 1030, a first deployment instance (e.g., deployment instance 1) 1040*a* located at a primary site, and a second deployment instance (e.g., deployment instance 2) 1040*b* located at a backup site. The primary site may be located on a vehicle or on the ground, and the backup site may be located on a vehicle (e.g., a different vehicle) or on the ground.

The first deployment instance 1040*a* comprises three pods (e.g., pod 1 1050*a*, pod 2 1050*b*, and pod 3 1050*c*). Each of the pods 1050*a*, 1050*b*, 1050*c* of the first deployment instance 1040*a* represents a containerized emulated LRU. The second deployment instance 1040*b* also comprises three pods (e.g., pod 1 1060*a*, pod 2 1060*b*, and pod 3 1060*c*). Each of the pods 1060*a*, 1060*b*, 1060*c* of the second deployment instance 1040*b* represents a clone containerized emulated LRU, which is a clone of the containerized emulated LRUs of the first deployment instance 1040*a*. For example, pod 1 1060*a* is a clone of pod 1 1050*a*, pod 2 1060*b* is a clone of pod 2 1050*b*, and pod 3 1060*c* is a clone of pod 3 1050*c*. Each of the pods 1050*a*, 1050*b*, 1050*c*, 1060*a*, 1060*b*, 1060*c* comprise specific applications (e.g., App 1, App 2, App 3), service/protocol specifications, and operating systems.

The engine 1010 of the system 1000 comprises a dashboard (e.g., a graphical user interface (GUI)), which allows for a user to choose which pods 1050*a*, 1050*b*, 1050*c*, 1060*a*, 1060*b*, 1060*c* (e.g., which containerized emulated LRUs and/or clone containerized emulated LRUs) to run. The orchestrator 1020 orchestrates the running by the engine 1010 of the pods 1050*a*, 1050*b*, 1050*c*, 1060*a*, 1060*b*, 1060*c* (which execute their associated applications) according to the instructions received at the engine 1010 by the user. And, the trusted repository is a storage location for software, which is utilized by the engine 1010 for the running of the pods 1050*a*, 1050*b*, 1050*c*, 1060*a*, 1060*b*, 1060*c*.

Figure 11:
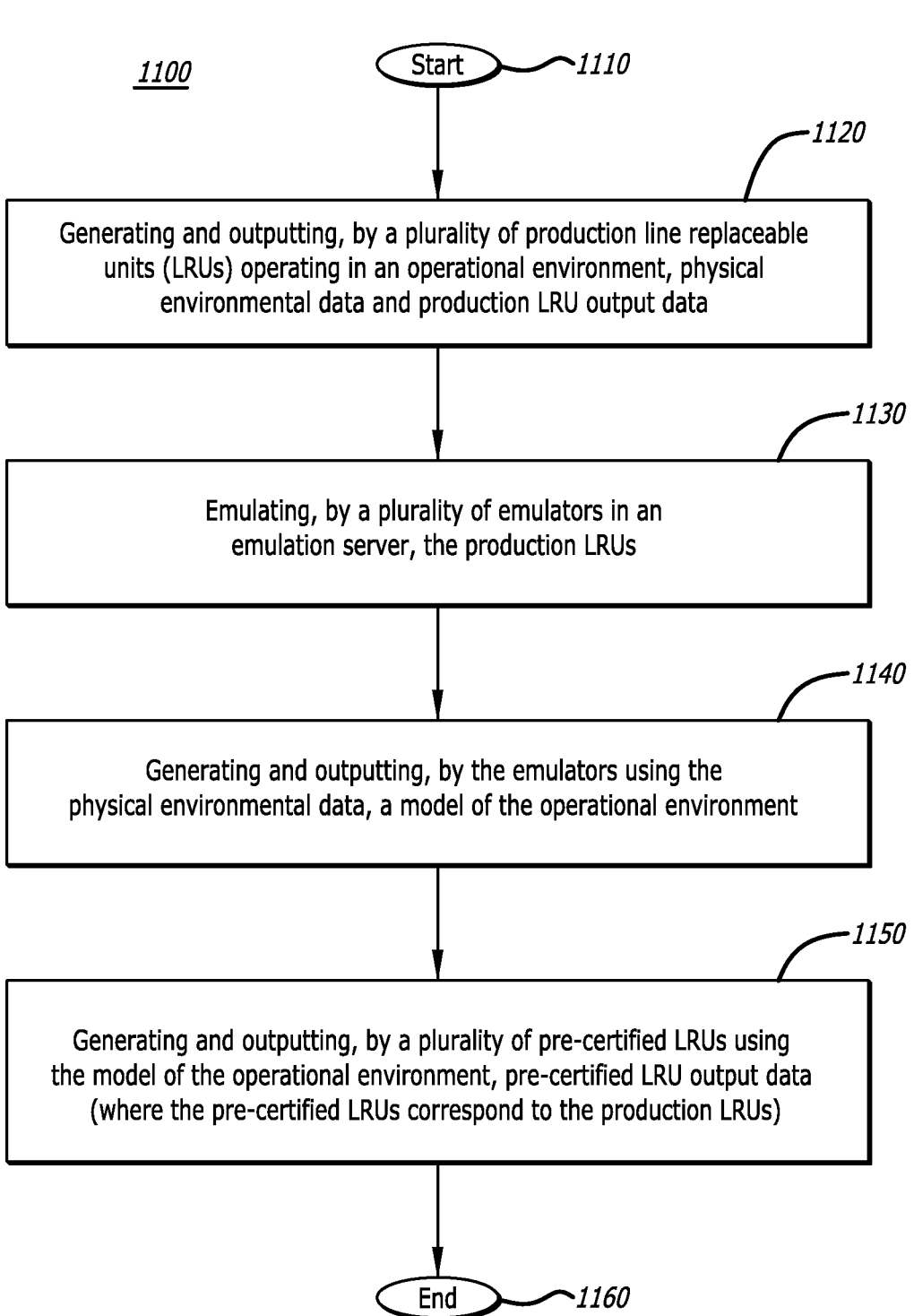
FIG. 11 is flow chart showing the disclosed method for operating an in emulated environment, in accordance with at least one embodiment of the present disclosure.

FIG. 11 is flow chart showing the disclosed method 1100 for operating an in emulated environment, in accordance with at least one embodiment of the present disclosure. At the start 1110 of the disclosed method 1100, a plurality of LRUs, operating in an operational environment, generate and output physical environmental data and production LRU data 1120. Then, a plurality of emulators, in an emulation server, emulate the production LRUs 1130. Emulators, using the physical environmental data, then generate and output a model of the operational environment 1140. Then, a plurality of pre-certified LRUs, using the model of the operational environment, generate and output pre-certified LRU output data 1150. In one or more embodiments, the pre-certified LRUs correspond to the production LRUs. Then, the method 1100 ends 1160.

FIG. 12 is flow chart showing another disclosed method 1200 for operating an in emulated environment, in accordance with at least one embodiment of the present disclosure. At the start 1210 of the method 1200, containerized emulators emulate production LRUs by running containerized algorithms associated with the production LRUs 1220. Then, clone containerized emulators emulate the production LRUs by running clone containerized algorithms associated with the production LRUs. In one or more embodiments, the clone containerized emulators are clones of at least some of the containerized emulators, and the clone containerized algorithms are clones of at least some of the containerized algorithms. Then, the method 1200 ends 1240.

FIG. 13 is flow chart showing yet another disclosed method 1300 for operating an in emulated environment, in accordance with at least one embodiment of the present disclosure. At the start 1310 of the method 1300, a plurality of production LRUs, operating in an operational environment on a primary aircraft, generate and output production LRU output data 1320. Then, a plurality of containerized emulators, in an emulation server on the primary aircraft, emulate the production LRUs by running containerized algorithms associated with the production LRUs using the production LRU output data 1330. A plurality of clone containerized emulators then emulate the production LRUs by running clone containerized algorithms associated with the production LRUs using the production LRU output data 1340. Then, the method 1300 ends 1350.

Figure 14:
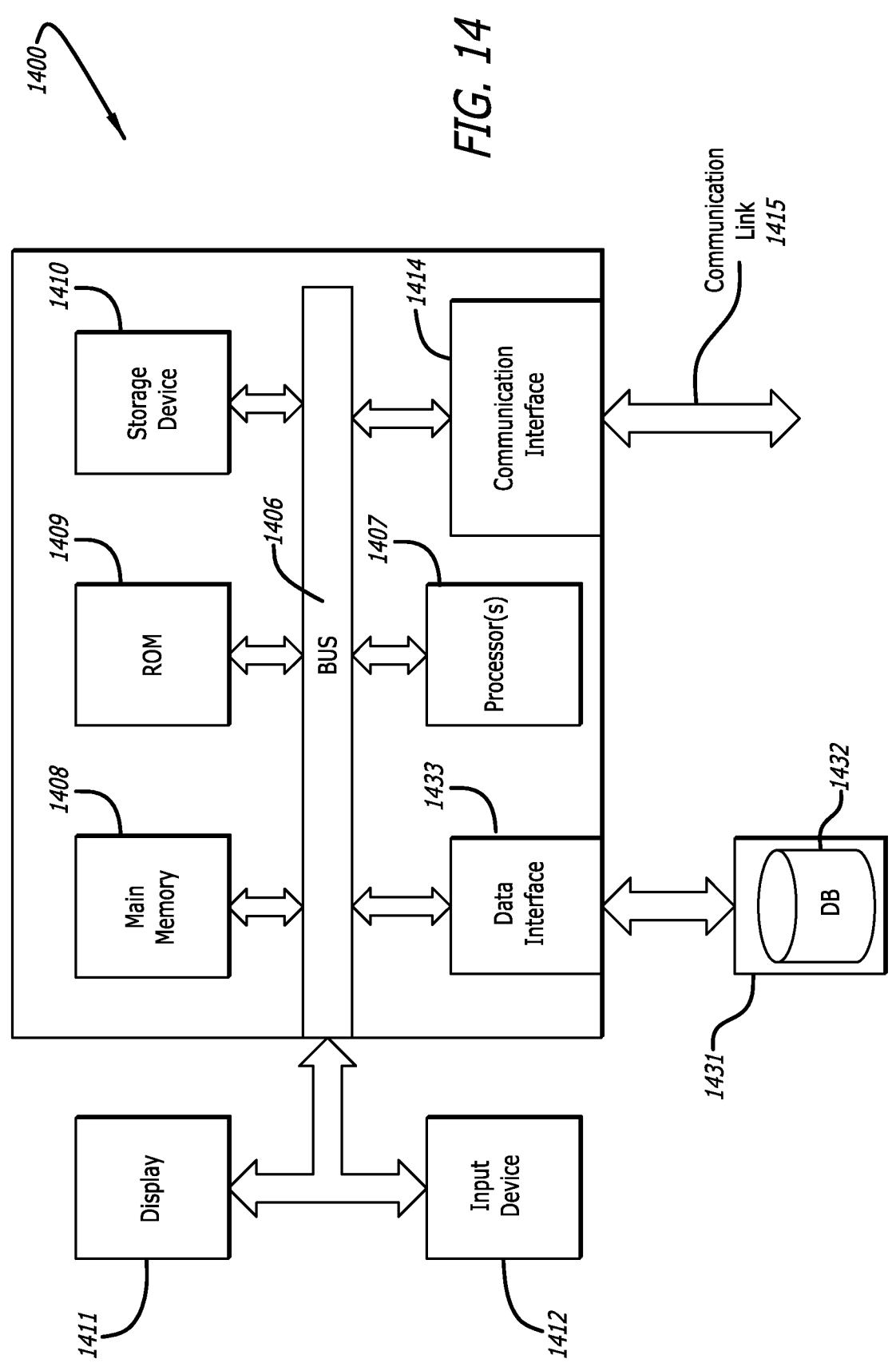
FIG. 14 illustrates a block diagram of an illustrative computing system suitable for implementing an embodiment of the present disclosure, in accordance with at least one embodiment of the present disclosure.

FIG. 14 illustrates a block diagram of an illustrative computing system suitable for implementing an embodiment of the present disclosure, in accordance with at least one embodiment of the present disclosure. For example, an aircraft (e.g., 510 of FIG. 5 and/or a ground facility (e.g., 530 of FIG. 5) of the disclosed system (e.g., system 300 of FIG. 3) may include and/or employ at least a portion of the disclosed computer system 1400. Computing system 1400 includes a bus 1406 or other communication mechanism for communicating information, which interconnects subsystems and devices, such as a processor(s) 1407, main memory 1408 (e.g., random access memory (RAM)), read only memory (ROM) (e.g., a static storage device) 1409, storage device 1410 (e.g., disk drive, magnetic or optical), communication interface 1414 (e.g., modem or Ethernet card), display 1411 (e.g., cathode ray tube (CRT) or liquid crystal display (LCD)), and input device 1412 (e.g., keyboard and cursor control).

According to one embodiment of the present disclosure, computer system 1400 performs specific operations by the processor(s) 1407 executing one or more sequences of one or more instructions contained in the main memory 1408. Such instructions may be read into the main memory 1408 from another computer readable/usable medium, such as ROM 1409 or storage device 1410. In alternative embodiments, hard-wired circuitry may be used in place of or in combination with software instructions to implement the present disclosure. Thus, embodiments of the present disclosure are not limited to any specific combination of hardware circuitry and/or software. In one embodiment, the term "logic" shall mean any combination of software or hardware that is used to implement all or part of the present disclosure.

The term "computer readable medium" or "computer usable medium" as used herein refers to any medium that participates in providing instructions to the processor(s) 1407 for execution. Such a medium may take many forms, including but not limited to, non-volatile media, volatile media, and transmission media. Non-volatile media includes, for example, optical or magnetic disks, such as storage device 1410. Volatile media includes dynamic memory, such as main memory 1408.

Common forms of computer readable media include, for example, floppy disk, flexible disk, hard disk, magnetic tape, any other magnetic medium, compact disc-read only memory (CD-ROM), any other optical medium, punch cards, paper tape, any other physical medium with patterns of holes, RAM, programmable read only memory (PROM), erasable programmable read only memory (EPROM), FLASH-EPROM, any other memory chip or cartridge, or any other medium from which a computer can read.

In an embodiment of the present disclosure, execution of the sequences of instructions to practice the present disclosure is performed by a single computer system 1400. According to other embodiments of the present disclosure, two or more computer systems 1400 coupled by communication link 1415 (e.g., local area network (LAN), public switched telephone network (PTSN), or wireless network) may perform the sequence of instructions required to practice the present disclosure in coordination with one another.

Computer system 1400 may transmit and receive messages, data, and instructions, including program (e.g., application code), through communication link 1415 and communication interface 1414. Received program code may be executed by the processor(s) 1407 as it is received, and/or stored in storage device 1410, or other non-volatile storage for later execution. Computer system 1400 may also interact with a database 1432 within a database system 1431 via a data interface 1433, where the computer system 1400 may store and retrieve information or data of the electronic design into and from the database system 1431.

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more steps or less steps of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of this disclosure. Many other examples exist, each differing from others in matters of detail only. Accordingly, it is intended that this disclosure be limited only to the extent required by the appended claims and the rules and principles of applicable law.

We claim:

1. A method for operating in an emulated environment, the method comprising:

obtaining, at an emulation server and from a plurality of production line replaceable units (LRUs) operating in a physical operational environment, physical environmental data and production LRU output data;

emulating, in the emulation server, the plurality of production LRUs by a plurality of emulation LRUs, wherein each emulation LRU of the plurality of emulation LRUs is configured to emulate operation of a respective production LRU of the plurality of production LRUs based on the physical environmental data and the production LRU output data;

generating, by the plurality of emulation LRUs, test environmental data that is based on the physical environmental data;

outputting the test environmental data to a plurality of test LRUs, wherein each test LRU of the plurality of test LRUs is configured to perform operations of a respective production LRU of the plurality of production LRUs;

obtaining, at the emulation server, test LRU output data from the plurality of test LRUs, wherein the test LRU output data is based on the test environmental data; and determining, in accordance with comparison data that is based on the production LRU output data and the test LRU output data, whether a test LRU is operating within tolerances to be certified as a production LRU.

2. The method of claim 1, wherein the method further comprises:

comparing the production LRU output data with the test LRU output data; and generating the comparison data based on comparing the production LRU output data with the test LRU output data.

3. The method of claim 1, wherein the plurality of production LRUs are connected to the emulation server via at least one input connector and an input patch panel.

4. The method of claim 3, wherein the at least one input connector comprises at least one of an Aeronautical Radio Incorporated (ARINC) 600 connector, a Quadrax connector, an ARINC 429/628 connector, or a universal serial bus (USB) port.

5. The method of claim 1, wherein the emulation server is connected to the plurality of test LRUs via at least one output connector and an output patch panel.

6. The method of claim 5, wherein the at least one output connector comprises at least one of an ARINC 600 connector, a Quadrax connector, an ARINC 429/628 connector, or a universal serial bus (USB) port.

7. The method of claim 1, wherein the plurality of production LRUs and the plurality of test LRUs comprise at least one of a mission computer, a flight management unit, an autopilot unit, a communications unit, a navigation unit, a collision avoidance unit, or a sensor.

8. The method of claim 1, wherein the plurality of production LRUs are operating on a vehicle.

9. The method of claim 8, wherein the vehicle is one of an airborne vehicle, a space vehicle, a terrestrial vehicle, or a marine vehicle.

10. The method of claim 8, wherein the plurality of test LRUs are operating on the vehicle or in a ground facility.

11. The method of claim 8, wherein the emulation server is operating on the vehicle or in a ground facility.

12. The method of claim 8, wherein the method further comprises generating, by the emulation server, a model of behavior of the vehicle based on the test environmental data.

13. The method of claim 8, wherein the method further comprises optimizing, by the emulation server, operation of at least one of the plurality of emulation LRUs based on at least one model of behavior of the vehicle.

14. The method of claim 13, wherein the optimizing of the operation of at least one of the plurality of emulation LRUs comprises optimizing at least one algorithm of at least one of the plurality of emulation LRUs.

15. The method of claim 13, wherein the emulation server uses machine learning to optimize the operation of at least one of the plurality of emulation LRUs based on the model of behavior of the vehicle.

16. The method of claim 8, wherein the method further comprises activating at least one customer option on at least one of at least one of the plurality of emulation LRUs or at least one of the plurality of test LRUs.

17. The method of claim 8, wherein the method further comprises running, on at least one of the plurality of emulation LRUs, at least one pre-certified algorithm.

18. The method of claim 1, wherein:

the physical environmental data comprises one or more voltages representing data sensed by the plurality of production LRUs, and the production LRU output data comprises data indicating one or more parameters identified by the plurality of production LRUs.

19. The method of claim 1, wherein the physical environmental data and the production LRU output data are based on physical environmental information sensed by the plurality of production LRUs.

20. A system for operating in an emulated environment, the system comprising:

a plurality of production line replaceable units (LRUs), operating in a physical operational environment, configured to output physical environmental data and production LRU output data to an emulation server;

a plurality of emulation LRUs, in the emulation server, configured to;

emulate the plurality of production LRUs, wherein each emulation LRU of the plurality of emulation LRUs is configured to emulate operation of a respective production LRU of the plurality of production LRUs based on the physical environmental data and the production LRU output data;

generate test environmental data that is based on the physical environmental data; and output the test environmental data to a plurality of test LRUs, wherein each test LRU of the plurality of test LRUs is configured to perform operations of a respective production LRU of the plurality of production LRUs; and the plurality of test LRUs configured to output test LRU output data to the emulation server based on the test environmental data, wherein the emulation server is configured to determine, in accordance with comparison data that is based on the production LRU output data and the test LRU output data, whether a test LRU is operating within tolerances to be certified as a production LRU.

* * * * *